(12) United States Patent
Morioka et al.

(10) Patent No.: US 12,149,205 B2
(45) Date of Patent: Nov. 19, 2024

(54) FAILURE DIAGNOSIS DEVICE FOR SOLAR BATTERY STRING, SOLAR POWER GENERATION SYSTEM EQUIPPED WITH SAME, AND FAILURE DIAGNOSIS METHOD FOR SOLAR BATTERY STRING

(71) Applicant: Mitsubishi Electric Corporation, Tokyo (JP)

(72) Inventors: Takayuki Morioka, Tokyo (JP); Hidetada Tokioka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/768,224

(22) PCT Filed: Jul. 29, 2020

(86) PCT No.: PCT/JP2020/029065
§ 371 (c)(1),
(2) Date: Apr. 12, 2022

(87) PCT Pub. No.: WO2021/124607
PCT Pub. Date: Jun. 24, 2021

(65) Prior Publication Data
US 2024/0113659 A1    Apr. 4, 2024

(30) Foreign Application Priority Data
Dec. 16, 2019  (JP) .................................. 2019-226420

(51) Int. Cl.
*G01R 31/389* (2019.01)
*H02S 50/10* (2014.01)

(52) U.S. Cl.
CPC ................................ *H02S 50/10* (2014.12)

(58) Field of Classification Search
CPC ..... H02S 50/10; G01R 31/389; G01R 31/392; G01R 31/367; G01N 27/026
See application file for complete search history.

(56) References Cited

U.S. PATENT DOCUMENTS

| 10,509,068 B2 | 12/2019 | Takeuchi et al. |
| 2013/0285670 A1* | 10/2013 | Yoshidomi ............. G01R 31/52 324/510 |

(Continued)

FOREIGN PATENT DOCUMENTS

JP    6481571 B2    3/2019

OTHER PUBLICATIONS

International Search Report and Written Opinion mailed on Oct. 6, 2020, received for PCT Application PCT/JP2020/029065, Filed on Jul. 29, 2020, 9 pages including English Translation.

*Primary Examiner* — Jermele M Hollington
*Assistant Examiner* — Taqi R Nasir
(74) *Attorney, Agent, or Firm* — XSENSUS LLP

(57) ABSTRACT

A failure diagnosis device for a solar battery string includes a plurality of solar battery modules having solar power generation parts and conductive frames, wherein the plurality of solar battery modules are electrically connected in series, and the frames of the plurality of solar battery modules electrically have common connection. The failure diagnosis device includes: a voltage supply part applying DC voltage between a positive electrode and a negative electrode of the plurality of solar battery modules connected in series; a measurement part measuring potential, generated by applying the DC voltage, between the positive electrode or the negative electrode of the plurality of solar battery modules connected in series and each of the frames; and a failure determination part determining a position of a faulty (Continued)

solar battery module in the solar battery string based on the potential measured by the measurement part.

15 Claims, 12 Drawing Sheets

(56) References Cited

U.S. PATENT DOCUMENTS

2018/0172751 A1* 6/2018 Takeuchi ................ H02S 50/00
2019/0140590 A1* 5/2019 Yura ...................... G01R 31/54

* cited by examiner

FAILURE DIAGNOSIS DEVICE FOR SOLAR BATTERY STRING, SOLAR POWER GENERATION SYSTEM EQUIPPED WITH SAME, AND FAILURE DIAGNOSIS METHOD FOR SOLAR BATTERY STRING

CROSS-REFERENCE TO RELATED APPLICATIONS

The present application is based on PCT filing PCT/JP2020/029065, filed Jul. 29, 2020, which claims priority to JP 2019-226420, filed Dec. 16, 2019, the entire contents of each are incorporated herein by reference.

TECHNICAL FIELD

The present disclosure relates to a failure diagnosis device for a solar battery string, a solar power generation system provided with the same, and a failure diagnosis method for the solar battery string.

BACKGROUND ART

A solar battery module includes a crystal type solar battery in which a solar battery cell is formed using a single-crystal or polycrystal silicon substrate or a thin film solar battery in which a silicon thin film is deposited on a glass substrate to form a solar battery cell, for example. The solar battery module is made up by parallelly connecting a plurality of solar battery clusters, in which the plurality of solar battery cells are connected in series, to have a panel-like shape, and mounting a frame as an outer frame and a terminal box. The terminal box includes a bypass diode bypassing a current path of a solar battery cluster when the current path of the solar battery cluster is disconnected or has high resistance, or when a power generation amount of a solar battery is reduced by reason that the solar battery is shaded. The bypass diode is parallelly connected to each solar battery cluster.

The plurality of solar battery modules are prepared, and solar power generation parts of the plurality of solar battery modules are connected in series. Furthermore, frames of these solar battery modules are fixed to a common metal cradle to constitute the solar battery string.

The plurality of solar battery strings are disposed in an array form and combined with a power transmission cable, a connection box, and a power conditioner to constitute a solar power generation system. Such a solar power generation system is used not only for a standard home power generation but also a large-scale solar power plant having a power generation amount of 1 MW or more.

The solar battery module does not generally have a mechanically-operating part, and a lifetime thereof is considered twenty years or more. However, actually reported are case examples that the solar battery module breaks down by various causes.

For example, the case examples that the solar battery module breaks down include a case where a cable in the solar battery string is disconnected, a case where a solar battery cluster of the solar battery module breaks down, or a bypass diode of the solar battery module breaks down. When the cable in the solar battery string is disconnected, a power generation amount of the solar battery string in which the cable is disconnected becomes zero, and a power generation loss occurs. When the solar battery cluster of the solar battery module breaks down, the faulty solar battery cluster does not generate power, and current generated in the other solar battery module and a solar battery cluster which is not faulty passes through a bypass diode. Accordingly, a loss of the power generation amount in the whole solar battery string can be avoided.

However, an occurrence of failure in the solar battery cluster is hardly found, and a loss of the power generation amount for the faulty solar battery cluster occurs. When the bypass diode of the solar battery module breaks down, a part of the solar battery cell electrically connected has high resistance in a case where a power generation amount is reduced in the solar battery clusters parallelly connected by influence of shade or a deterioration thereof. When current flows in the solar battery cluster having high resistance, the solar battery cluster may generate heat in some cases.

Thus, required is a technique of efficiently diagnosing a failure in the solar battery module in the solar battery string to increase reliability of the solar power generation system and also achieve further spread of the system. For example, proposed as a method of specifying a failure in a bypass diode of a solar battery module in a solar battery string is a method of specifying a position of failure in the bypass diode by applying AC voltage to the solar battery string to measure the AC voltage (refer to Patent Document 1, for example).

PRIOR ART DOCUMENTS

Patent Documents

Patent Document 1: U.S. Pat. No. 6,481,571

SUMMARY

Problem to be Solved by the Invention

However, the AC voltage is used in the conventional failure diagnosis method, thus there is a possibility that capacitive coupling occurs in an unintended position in the solar battery string or the solar power generation system depending on a frequency of the AC voltage. Such a case has a problem that a desired electrical signal cannot be measured, and an accurate position of failure cannot be specified in some cases.

The present disclosure is therefore has been made to solve such conventional problems, and it is an object to provide a failure diagnosis device for a solar battery string capable of accurately specifying a position of a faulty solar battery module in a solar battery string, a solar power generation system provided with the same, and a failure diagnosis method for the solar battery string.

Means to Solve the Problem

In order to achieve the above purpose, a failure diagnosis device for a solar battery string and a solar power generation system provided with the same according to the present disclosure is a failure diagnosis device for a solar battery string including a plurality of solar battery modules having solar power generation parts and conductive frames, wherein the solar power generation parts of the plurality of solar battery modules are electrically connected in series, and the frames of the plurality of solar battery modules electrically have common connection and are grounded. The failure diagnosis device includes: a voltage supply part applying DC voltage between a positive electrode and a negative electrode of the plurality of solar battery modules connected in series in the solar battery string; a measurement part measuring potential, generated by applying the DC voltage, between the positive electrode or the negative electrode of the plurality of solar battery modules connected in series in the solar battery string and each of the frames; and a failure determination part determining a position of a faulty solar battery module in the solar battery string based on the potential measured by the measurement part.

A failure diagnosis method for a solar battery string according to the present disclosure is a failure diagnosis method for a solar battery string including a plurality of solar battery modules having solar power generation parts and conductive frames, wherein the solar power generation parts of the plurality of solar battery modules are electrically connected in series, and the frames of the plurality of solar battery modules electrically have common connection and are grounded. The failure diagnosis method includes steps of: applying DC voltage between a positive electrode and a negative electrode of the plurality of solar battery modules connected in series in the solar battery string from a voltage supply part; measuring potential, generated by applying the DC voltage, between the positive electrode or the negative electrode of the plurality of solar battery modules connected in series in the solar battery string and each of the frames, in a measurement part; and a failure determination process of determining, by a failure determination part, a position of a faulty solar battery module in the solar battery string based on the potential measured by the measurement part.

Effects of the Invention

According to the failure diagnosis device for the solar battery string, the solar power generation system provided with the same, and the failure diagnosis method for the solar battery string of the present disclosure having the above configurations, the position of the faulty solar battery module in the solar battery string can be accurately specified.

DESCRIPTION OF EMBODIMENT(S)

Described firstly with reference to the diagrams are configurations of a failure diagnosis device for a solar battery string, a solar power generation system provided with the same, and a failure diagnosis method for a solar battery string according to the present disclosure. The diagrams are schematically illustrated to conceptionally describe a function or a structure. The present application is not limited by embodiments described hereinafter. Basic configurations of a failure diagnosis device for a solar battery string, a solar power generation system provided with the same, and a failure diagnosis method for a solar battery string are common in all the embodiments if not otherwise specified. Constituent elements assigned with the same reference signs are the same elements or equivalent thereto, and this is common in all the sentences of the specification.

Embodiment 1

Figure 1:
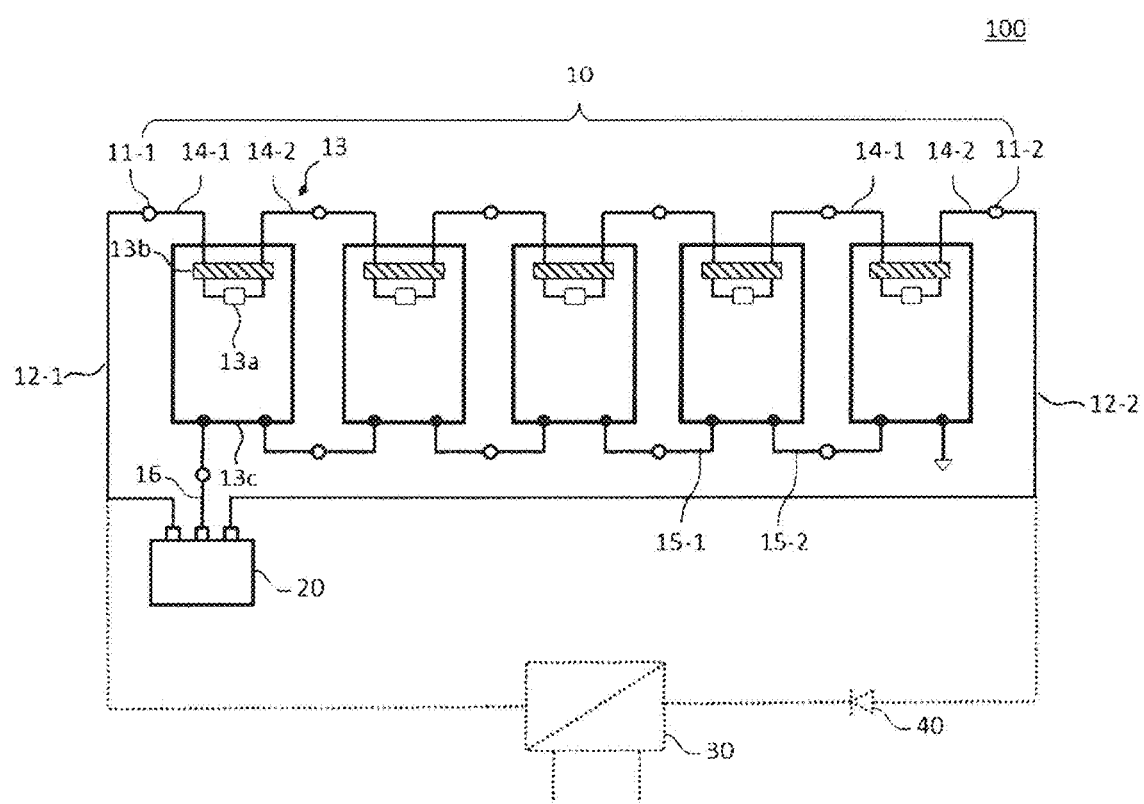
FIG. 1 A diagram schematically illustrating a configuration of a solar power generation system according to an embodiment 1.
Figure 2:
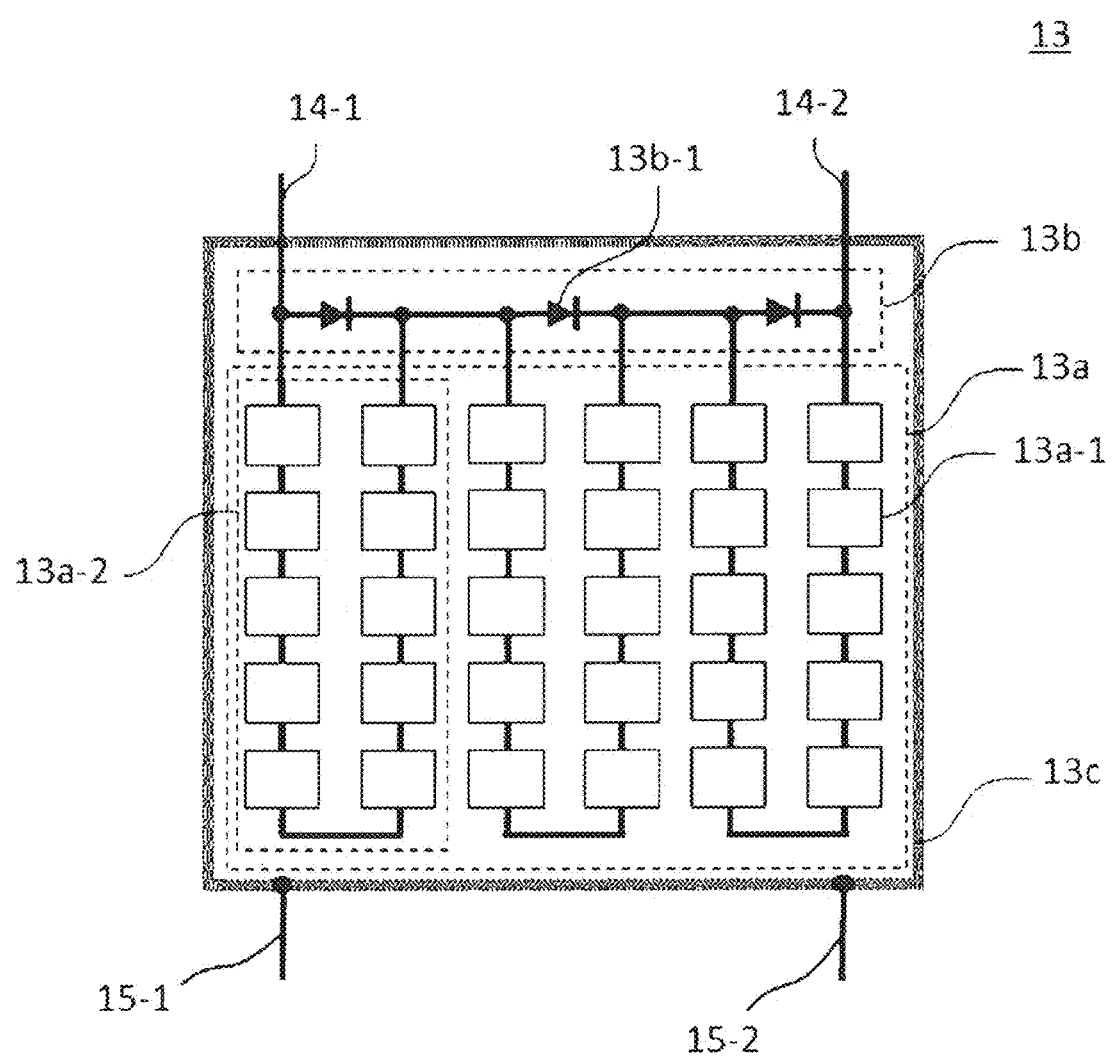
FIG. 2 A diagram schematically illustrating a configuration of a solar battery module according to the embodiment 1.
Figure 3:
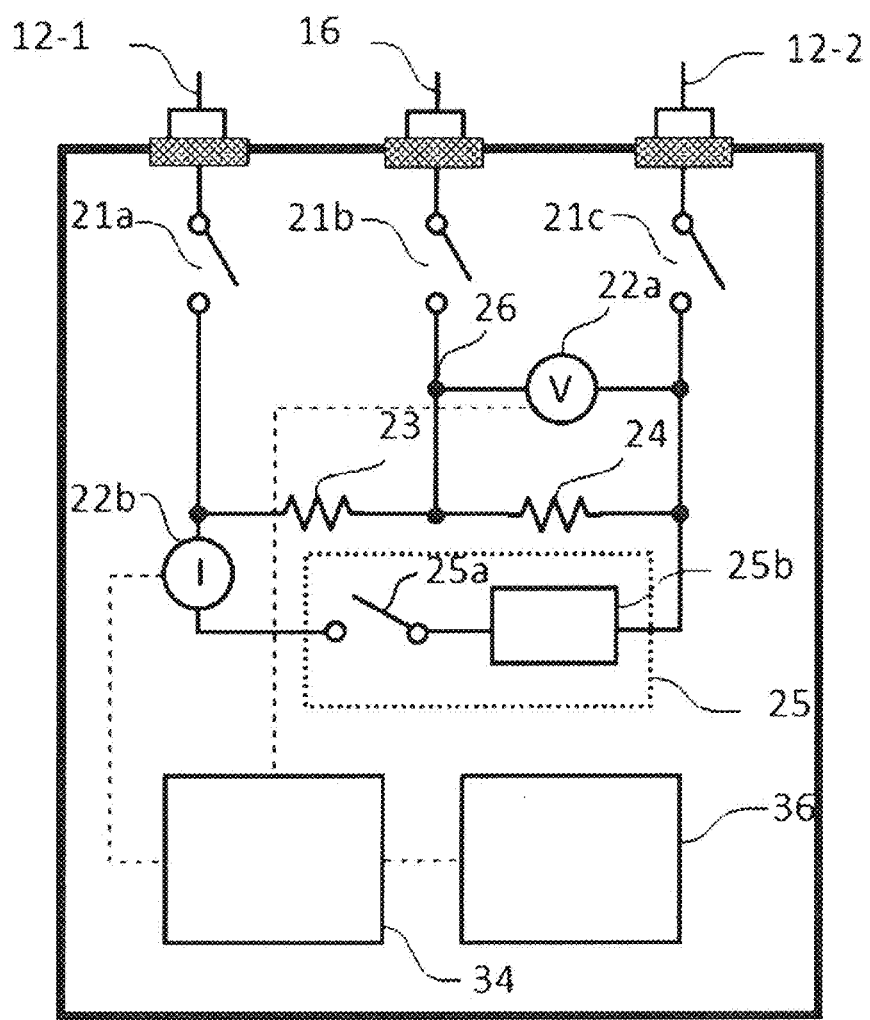
FIG. 3 A diagram schematically illustrating a configuration of a failure diagnosis device according to the embodiment 1.

FIG. 1 is a diagram schematically illustrating a configuration of a solar power generation system according the present embodiment. FIG. 2 is a diagram schematically illustrating a configuration of a solar battery module according the present embodiment. FIG. 3 is a diagram schematically illustrating a configuration of a failure diagnosis device according the present embodiment.

As illustrated in FIG. 1, a solar power generation system 100 includes a solar battery string 10 and a failure diagnosis device 20 connected to the solar battery string 10 to diagnose a failure in the solar battery string 10. The solar battery string 10 includes an output terminal 11-1 on a negative electrode side and an output terminal 11-2 on a positive electrode side, and the output terminals 11-1 and 11-2 are electrically connected to the failure diagnosis device 20 via output cables 12-1 and 12-2. The output terminal 11-1 on the negative electrode side of the solar battery string 10 is electrically connected to a power conditioner 30 via the output cable 12-1 and a switching means such as a switch not shown in the diagrams. The output terminal 11-2 on the positive electrode side of the solar battery string 10 is electrically connected to a backflow prevention diode 40 and the power conditioner 30 via the output cable 12-2 and a switching means such as a switch not shown in the diagrams. Electrical power generated in the solar battery string 10 is output from the output terminals 11-1 and 11-2 to the power conditioner 30 via the output cables 12-1 and 12-2.

The solar battery string 10 includes a plurality of solar battery modules 13 as illustrated in FIG. 1. Each of the plurality of solar battery modules 13 includes a solar power generation part 13a, a terminal box 13b, and a frame 13c. Herein, the plurality of solar battery strings 10 may be parallelly connected, and the number of the solar battery modules 13 is not limited to five. It is sufficient that two or more solar battery modules 13 are connected in series.

The solar power generation part 13a generates power in accordance with received solar light. As illustrated in FIG. 2, in the solar power generation part 13a, a plurality of solar battery clusters 13a-2 made up of a plurality of solar battery cells 13a-1 connected in series are connected in series. Herein, it is sufficient that the solar battery cell 13a-1 is a solar battery cell made up of a semiconductor using a pn junction. For example, applied to the solar battery cell 13a-1 is a crystal type solar battery cell made up of a single crystal silicon substrate or a thin film solar battery cell made up of a glass substrate and a silicon thin film.

The terminal box 13b is disposed on a back surface side of the solar battery module 13 and takes out power generated in the solar power generation part 13a. The terminal box 13b is electrically connected to the output terminal 11-1 on the negative electrode side and the output terminal 11-2 on the positive electrode side. Accordingly, the generated power taken out in the terminal box 13b is output outside the solar battery string 10 via the output terminals 11-1 and 11-2.

As illustrated in FIG. 2, the terminal box 13b includes a plurality of bypass diodes 13b-1. The plurality of bypass diodes 13b-1 are connected in series so that a cable 14-1 on a negative electrode side is located on an anode side and a cable 14-2 on a positive electrode side is located on a cathode side. Each of the bypass diodes 13b-1 is parallelly connected to the solar battery cluster 13a-2. The power generated by the three solar battery clusters 13a-2 is output to a positive electrode and a negative electrode of the solar battery module 13.

The frame 13c is a conductive frame such as a metal frame, and is disposed on an outer peripheral part of the solar battery module 13. The frame 13c is normally electrically insulated from the solar power generation part 13a, the terminal box 13b, and the output terminals 11-1 and 11-2.

In the plurality of solar battery modules 13 of the solar battery string 10, as illustrated in FIG. 1, the plurality of solar power generation parts 13a are electrically connected by the output cables 14-1 and 14-2 in series. That is to say, as a series connection, in the present embodiment, the output cable 14-2 on the positive electrode side of one solar battery module 13 and the output cable 14-1 on the negative electrode side of the other solar battery module 13 are connected to each other in the optional two solar battery modules 13 adjacent to each other. As a result, the output cable 14-1 of the solar battery module 13 located on one end and the output cable 14-2 of the solar battery module 13 located on the other end function as output cables which are not used for series connection, and the output cables 14-1 and 14-2 are electrically connected to the output terminals 11-1 and 11-2, respectively.

The plurality of frames 13c of the plurality of solar battery modules 13 electrically have common connection as illustrated in FIG. 1. As such a common connection, in the present embodiment, the frame 13c of one solar battery module 13 and the frame 13c of the other solar battery module 13 in the optional two solar battery modules 13 adjacent to each other are electrically connected to each other via ground wirings 15-1 and 15-2, and the ground wiring 15-2 of the frame 13c of the solar battery module 13 located on the other end is grounded. The connection between the frames 13c is not limited to such a series connection. When the solar battery module 13 is fixed to a metal cradle and disposed outdoors, the electrical connection between the frames 13c may be performed by the cradle in place of the ground wiring, for example. The ground wiring 15-1 of the frame 13c of the solar battery module 13 located on one end is electrically connected not only to the frame 13c of the adjacent solar battery module 13 but also to the failure diagnosis device 20 via the ground wiring 16.

As illustrated in FIG. 3, the failure diagnosis device 20 includes a switch 21a having one end connected to the output cable 12-1, a switch 21c having one end connected to the output cable 12-2, a switch 21b having one end connected to the ground wiring 16, a resistance 23 connected to the other end of the switch 21a and the other end of the switch 21b, a resistance 24 connected to the other end of the switch 21b and the other end of the switch 21c, a voltmeter 22a parallelly connected to the resistance 24, a DC voltage apply part 25 connected to the other end of the switch 21a and the other end of the switch 21c, and an ammeter 22b as a measurement part connected to the DC voltage apply part 25 for measuring a current value I0 generated by applying direct current voltage V0.

The DC voltage apply part 25 includes a switch 25a and a DC power source 25b. The DC power source 25b of the DC voltage apply part 25 is connected to the other end of the switch 21a via the switch 25a. The DC voltage apply part 25 performs ON/OFF control on the switch 25a, thereby being able to apply the positive DC voltage V0 to the positive electrode side based on the negative electrode side of the solar battery string 10 or apply the positive DC voltage V0 to the negative electrode side based on the positive electrode side of the solar battery string 10.

Potential of the voltmeter 22a is based on a contact point 26 grounded via the ground wiring 16 when the switch 21b is closed. That is to say, the voltmeter 22a can measure, as a measurement part, a value of potential Vp-gnd between the positive electrode side as one end of the solar battery string 10 and the ground based on the contact point 26.

Herein, impedance between measurement terminals of the voltmeter 22a is sufficiently larger than the resistance 23.

Herein, the switches 21a, 21b, 21c, and 25a may be a manual toggle switch, a switching element such as a metal oxide semiconductor field effect transistor (MOSFET) driven by a gate signal, or a mechanical relay, for example.

Furthermore, the failure diagnosis device 20 includes a measurement control part 34 and a failure determination part 36 as illustrated in FIG. 3.

The measurement control part 34 performs switching control on the switch 21a, the switch 21b, the switch 21c, and the switch 25a in accordance with a measurement flow described hereinafter, thereby being able to apply the positive voltage V0 to the positive electrode side based on the negative electrode side of the solar battery string 10 or apply the positive voltage V0 to the negative electrode side based on the positive electrode side of the solar battery string 10. Inputted to the measurement control part 34 are the current value I0 measured with the ammeter 22b and the value of the potential Vp-gnd between the positive electrode side of the solar battery string 10 and the ground measured with the voltmeter 22a.

The failure determination part 36 determines whether a failure cause is any of a cable disconnection, a solar battery cluster failure, a bypass diode failure, or there is no failure based on the current value I0 outputted from the measurement control part 34 in accordance with the measurement flow described hereinafter. Furthermore, the failure determination part 36 determines the position of the faulty solar battery module 13 in the solar battery string 10 based on the voltage value Vp-gnd outputted from the measurement control part 34. In the present embodiment, the failure determination part 36 determines the position of the solar battery module 13 in which the bypass diode 13b-1 is faulty in the solar battery string 10 based on the voltage value Vp-gnd outputted from the measurement control part 34.

Herein, the measurement control part 34 and the failure determination part 36 are made up of processor or a central processing unit (CPU) and a storage device such as a semiconductor memory not shown in the drawings, and are achieved when the processor or the CPU executes a program stored in the storage device such as the semiconductor memory, for example. Not only the measurement control part 34 and the failure determination part 36 but also control of the failure diagnosis device 20 and control of storing and transferring measurement data, for example, may also be achieved as a function of the processor or the CPU, or a sequential operation from the measurement to the output of the diagnosis result may also be automatically performed.

The solar power generation system 100 and the failure diagnosis device 20 of the solar battery string 10 according to the present embodiment are made up in the manner described above.

Figure 4:
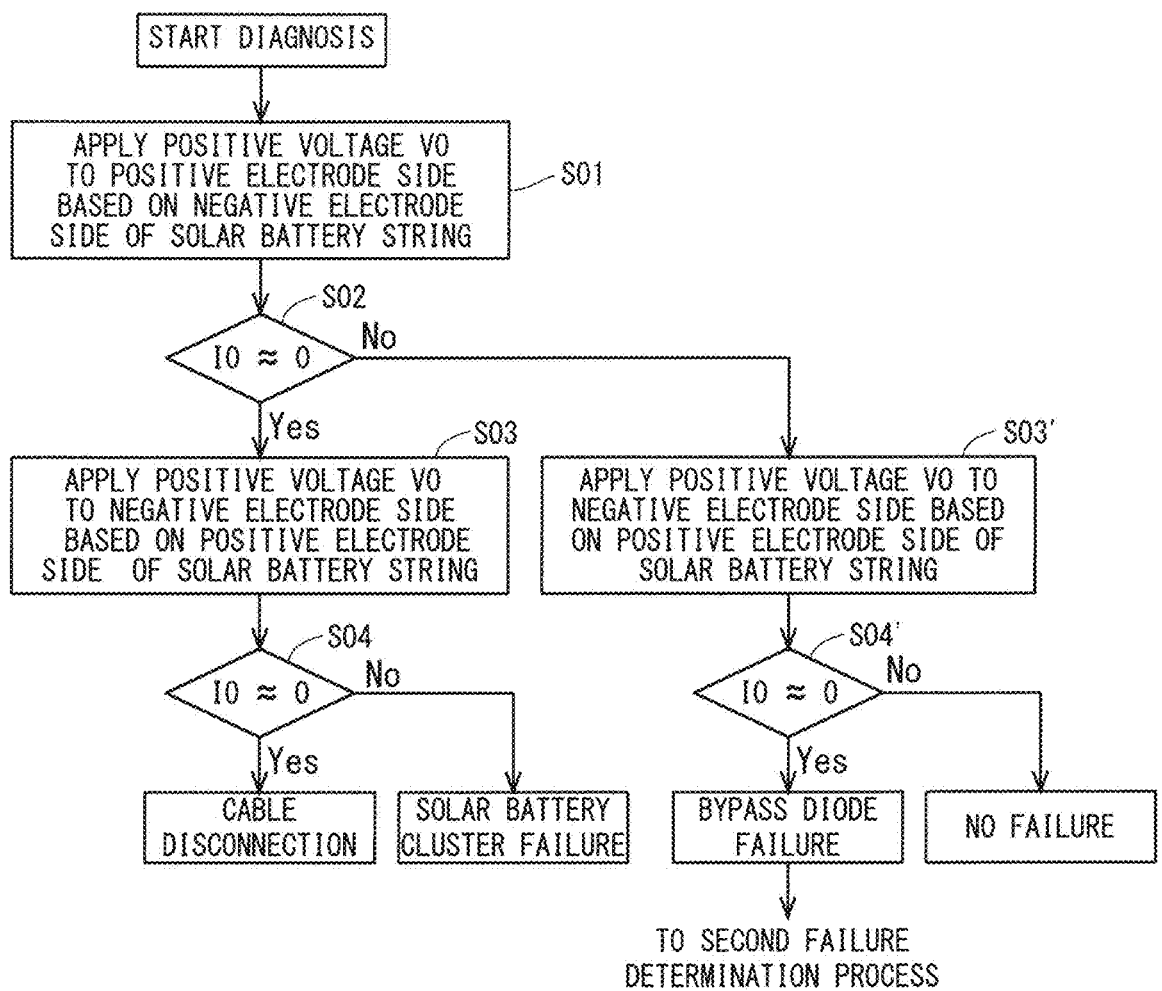
FIG. 4 A flow chart illustrating an operation of the failure diagnosis device determining a failure cause of a solar battery string according to the embodiment 1.
Figure 5:
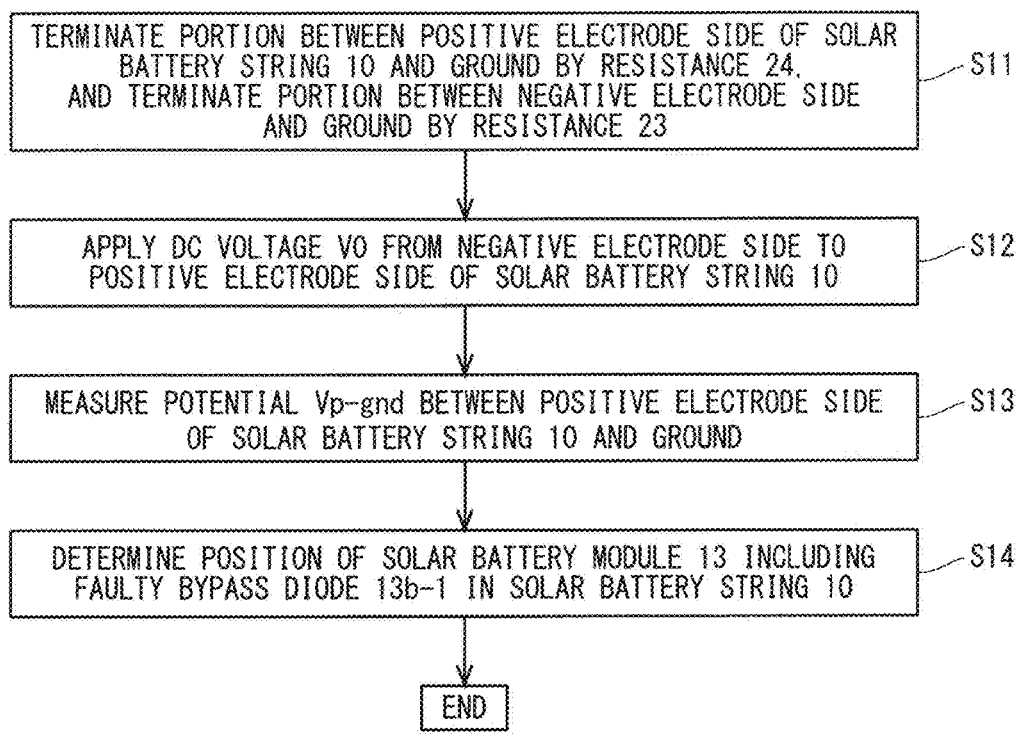
FIG. 5 A flow chart illustrating an operation of the failure diagnosis device determining a position of a solar battery module in which a bypass diode in the solar battery string is faulty according to the embodiment 1.

An operation of the solar power generation system 100 and the failure diagnosis device 20 of the solar battery string 10 according to the present embodiment is described next. FIG. 4 is a flow chart illustrating an operation of the failure diagnosis device 20 determining a failure cause of the solar battery string 10 according to the present embodiment. FIG. 5 is a flow chart illustrating an operation of the failure diagnosis device 20 determining a position of the solar battery module 13 including the faulty bypass diode 13b-1 in the solar battery string 10. Herein, in the solar power generation system 100 and the failure diagnosis device 20 of the solar battery string 10 according to the present embodiment, the diagnosis is started at a time when the solar battery module 13 is in a dark state such as a night time when the solar power generation part 13a of the solar battery module 13 does not generate power, for example.

As illustrated in FIG. 4, when the failure diagnosis device 20 starts diagnosis of the solar battery string 10, a switching part such as a switch not shown separates the solar battery string 10 and the power conditioner 30, and then the failure diagnosis device 20 performs a first failure determination process of determining a failure cause of the solar battery string 10 firstly.

Firstly, the measurement control part 34 turns on the switch 21c in the failure diagnosis device 20, and electrically connects the cable 12-2 on the positive electrode side of the solar battery string 10 and a positive voltage output side of the DC voltage apply part 25. The measurement control part 34 turns on the switch 21a, and electrically connects the cable 12-1 on the negative electrode side of the solar battery string 10 and a negative electrode side of the DC voltage apply part 25.

Next, the measurement control part 34 turns on the switch 25a, and applies the positive DC voltage V0 to the positive electrode side based on the negative electrode side of the solar battery string 10 by the DC power source 25b (S01).

Then, the ammeter 22b measures the current value I0 generated by applying the DC voltage V0, and outputs the current value I0 to the measurement control part 34. The failure determination part 36 determines whether the current value I0 inputted to the measurement control part 34 is I0≈0 (S02).

At this time, when there is no solar battery cluster failure and cable disconnection, current flows in a pn junction of the solar battery cell 13a-1 constituting the solar battery cluster 13a-2 in a forward direction, thus I0≈0 is not established.

In contrast, when there is a solar battery cluster failure and a cable disconnection, even if the positive DC voltage V0 is applied to the positive electrode side based on the negative electrode side of the solar battery string 10, current cannot flow in any of the solar battery cluster 13a-2, the bypass diode 13b-1, and cables 12-1, 12-2, 14-1, and 14-2, thus I0≈0 is established.

That is to say, when the failure determination part 36 determines that I0≈0 is not established, the process proceeds to Step S03', and when the failure determination part 36 determines that I0≈0 is established, the process proceeds to Step S03.

Herein, the bypass diode failure indicates a state where any of the plurality of bypass diodes 13b-1 in the solar battery module 13 breaks down, and current does not flow in the forward direction and disconnection occurs. The cable disconnection indicates a state where any of the cable 12-2 on the positive electrode side, the cable 12-1 on the negative electrode side, and the output cables 14-1 and 14-2 connecting the solar battery module illustrated in FIG. 1 is disconnected. The solar battery cluster failure indicates a state where at least one of the solar battery cells 13a-1 of the solar battery cluster 13a-2 is fault and disconnection occurs.

Next, when the failure determination part 36 determines that I0≈0 is established, the measurement control part 34 turns on the switch 25a, and applies the positive voltage V0 to the negative electrode side based on the positive electrode side of the solar battery string 10 by the DC power source 25b (S03).

Then, the ammeter 22b measures the current value I0 generated by applying the DC voltage V0, and outputs the current value I0 to the measurement control part 34. The failure determination part 36 determines whether the current value I0 inputted to the measurement control part 34 is I0≈0 (S04).

At this time, the positive voltage V0 is applied to the negative electrode side based on the positive electrode side of the solar battery string 10 by the DC power source 25b, thus when the solar battery cluster 13a-2 is faulty, the forward current flows in the bypass diode 13b-1, and I0≈0 is not established. In contrast, when there is a cable disconnection, the current does not flow in any of the solar battery cluster 13a-2, the bypass diode 13b-1, and the cables 12-1, 12-2, 14-1, and 14-2, thus I0≈0 is established.

That is to say, when the failure determination part 36 determines that I0≈0 is not established in Step S04, it is determined that the solar battery cluster 13a-2 is faulty, and when the failure determination part 36 determines that I0≈0 is established, it is determined that the cable disconnection occurs. The failure determination part 36 transmits a result of the solar battery cluster failure or the cable disconnection determined in Step S04 to the user, and the failure diagnosis is finished.

Returning to Step S02, when the failure determination part 36 determines that I0≈0 is not established, the measurement control part 34 turns on the switch 25a, and applies the positive voltage V0 to the negative electrode side based on the positive electrode side of the solar battery string 10 by the DC power source 25b (S03').

Then, the ammeter 22b measures the current value I0 generated by applying the DC voltage V0, and outputs the current value I0 to the measurement control part 34. The failure determination part 36 determines whether the current value I0 inputted to the measurement control part 34 is I0≈0 (S04').

At this time, the positive voltage V0 is applied to the negative electrode side based on the positive electrode side of the solar battery string 10 by the DC power source 25b, thus when the bypass diode 13b-1 is not faulty, the forward current flows in the bypass diode 13b-1, and I0≈0 is not established.

In contrast, when the bypass diode 13b-1 is faulty, the forward current does not flow in the bypass diode 13b-1, and I0≈0 is established. For example, when the solar battery string 10 includes the solar battery module 13 in which open fault occurs in the bypass diode 13b-1, current hardly flows from the DC power source 25b, and the steady current value I0 flowing from the DC power source 25b becomes a low output current value smaller than 1 mA in a case where the voltage V0=10V of the DC power source 25b is established.

That is to say, in Step S04', when the failure determination part 36 determines that I0≈0 is not established, it determines that the bypass diode 13b-1 is not faulty, and none of the solar battery cluster 13a-2, the bypass diode 13b-1, and the cables 12-1, 12-2, 14-1, and 14-2 is faulty. The failure determination part 36 transmits a result that the solar battery module 13 is not faulty to the user, and the failure diagnosis is finished. When the failure determination part 36 determines that I0≈0 is established, it determines that the bypass diode 13b-1 of any of the solar battery module 13 in the solar battery string 10 is faulty, and the process proceeds to a second failure determination process of determining the position of the solar battery module 13 in which the bypass diode 13b-1 is faulty in the solar battery string 10. Then, the switch 25a is turned off, and the first failure determination process is finished.

Firstly, in the second failure determination process, as illustrated in FIG. 5, the switch 21b is turned on, and the ground wiring 16 of the solar battery string 10 is electrically connected to the resistance 23 and the resistance 24. Accordingly, the positive electrode side of the solar battery string 10 is electrically connected to the ground wiring 16 via the resistance 23, and a portion between the positive electrode side of the solar battery string 10 and the ground is terminated by the resistance 23. The negative electrode side of the solar battery string 10 is electrically connected to the ground wiring 16 via the resistance 24, and a portion between the negative electrode side of the solar battery string 10 and the ground is terminated by the resistance 24 (S11). Accordingly, the positive electrode side of the solar battery string 10, the negative electrode side of the solar battery string 10, and the grounded frame have equivalent potential.

Next, the switch 25a is turned on again, and the positive DC voltage V0 is applied from the negative electrode side to the positive electrode side of the solar battery string 10 (S12). A rise time of the voltage at the time of applying the DC voltage is preferably as fast as possible, and for example, the DC voltage V0 is applied at a through rate of 10V/µs by a high-speed switching of a MOSFET. At this time, both the resistance 23 and the resistance 24 may be paralleled off from the contact point 26 immediately before the voltage is applied by a switch not shown in the drawings.

Next, the voltmeter 22a measures the value of the potential Vp-gnd between the positive electrode side of the solar battery string 10 and the ground at the time of applying the DC voltage V0 (S13). Although details are described hereinafter, at this time, the potential Vp-gnd between the positive electrode side of the solar battery string 10 and the ground indicates a voltage value depending on the position of the solar battery module 13 in which the bypass diode 13b-1 is disconnected and faulty in the solar battery string 10. The measured voltage value Vp-gnd is inputted to the measurement control part 34.

Next, the failure determination part 36 determines the position of the solar battery module 13 in which the bypass diode 13b-1 is faulty in the solar battery string 10 based on the voltage value Vp-gnd inputted to the measurement control part 34 (S14). Although details are described hereinafter, the position of the solar battery module 13 in which the bypass diode 13b-1 is faulty depends on −Vp-gnd/V0 immediately after the DC voltage V0 is applied. Thus, the failure determination part 36 calculates −Vp-gnd/V0, and specifies the position of the solar battery module 13 in which the bypass diode 13b-1 is faulty in the solar battery string 10 based on −Vp-gnd/V0.

Subsequently, the failure determination part 36 transmits a notification that the solar battery string 10 includes the solar battery module 13 including the faulty bypass diode 13b-1. Furthermore, the failure determination part 36 transmits, to the user, a notification of a position result of the solar battery module 13 including the faulty bypass diode 13b-1 in the solar battery string 10 determined in Step S14.

Finally, the switches 21a, 21b, 21c, and 25a are turned off, and the failure diagnosis device 20 is electrically separated from the solar battery string 10 to finish the second failure determination process.

Described next is a detailed operation principle of the solar power generation system 100 and the failure diagnosis device 20 of the solar battery string 10 according to the present embodiment.

Figure 6:
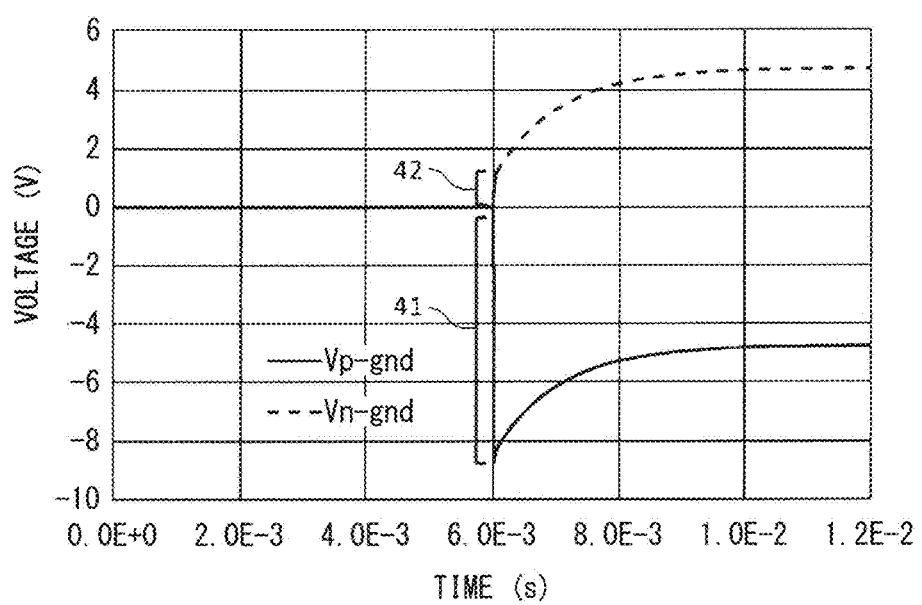
FIG. 6 A diagram for describing an operation principle of the failure diagnosis device determining the position of the faulty solar battery module according to the embodiment 1.

FIG. 6 is a diagram for describing an operation principle of the failure diagnosis device 20 determining the position of the faulty solar battery module 13 according to the present embodiment. FIG. 6 is a diagram illustrating an example of time-series data of the voltage value Vp-gnd and the voltage value Vn-gnd before and after a moment of applying the DC voltage V0 in Step S13. Specifically, FIG. 6 is a diagram illustrating an example of time-series data of the voltage value Vp-gnd and the voltage value Vn-gnd in a case where an open fault occurs in the bypass diode 13b-1 parallelly connected to the solar battery cluster 13a-2 in a center of the fifth solar battery module 13 from the negative electrode side of the solar battery string 10. Herein, the voltage Vn-gnd is a voltage value based on ground potential of the negative electrode side of the solar battery string 10 at the time of applying the DC voltage V0.

As illustrated in FIG. 6, when an open fault occurs in the bypass diode 13b-1 parallelly connected to the solar battery cluster 13a-2 in the center of the fifth solar battery module 13 from the negative electrode side of the solar battery string 10, the DC voltage V0 is divided into the voltage Vp-gnd and the voltage Vn-gnd at a moment of time 6.0E-3 seconds when the DC voltage V0 is applied to a portion between both terminals of the positive electrode and the negative electrode of the solar battery string 10. For example, when the bypass diode 13b-1 parallelly connected to the solar battery cluster 13a-2 in the center of the fifth solar battery module 13 from the negative electrode side of the solar battery string 10 breaks down, the voltage −Vp-gnd and the voltage Vn-gnd made by dividing the DC voltage V0 by the ground potential are divided at a ratio of −Vp-gad:Vn-gnd=9:1 immediately after applying the DC voltage V0, and indicated by a ratio of 41 and 42 in FIG. 6. The same applies to a case where open fault occurs in the bypass diode 13b-1 of the other solar battery module 13 in the solar battery string 10, and the ratio of the voltage −Vp-gnd and the voltage Vn-gnd made by dividing the DC voltage V0 by the ground potential depends on the position of the solar battery module 13 including the faulty bypass diode 13b-1 immediately after applying the DC voltage V0 and indicates a partial pressure ratio different from the above case. The reason thereof is described in detail hereinafter.

Figure 7A:
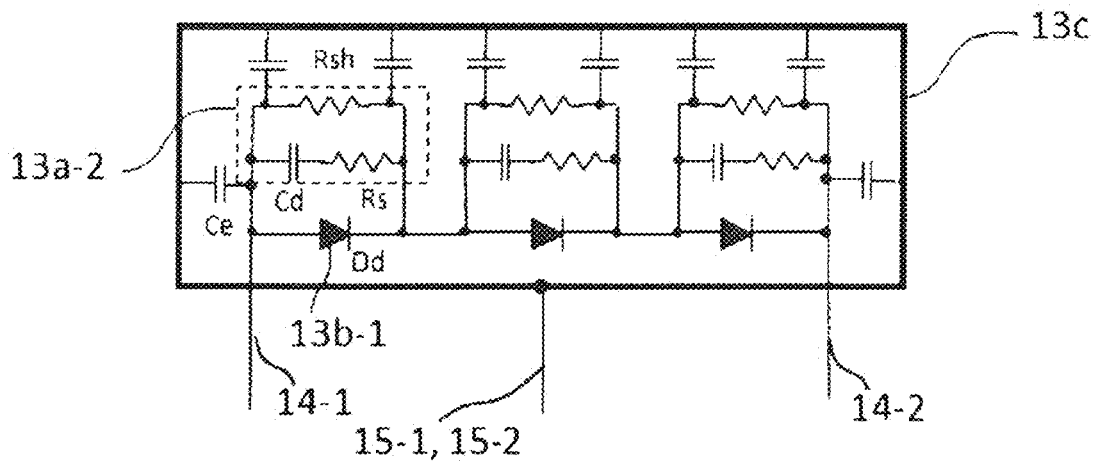
FIGS. 7A to 7C Equivalent circuit diagrams of the solar battery module and the solar battery string for describing an operation principle of the failure diagnosis device determining the position of the faulty solar battery module according to the embodiment 1.
Figure 7B:
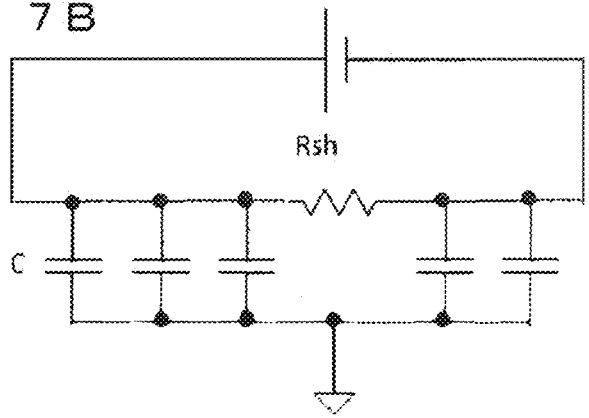
Figure 7C:
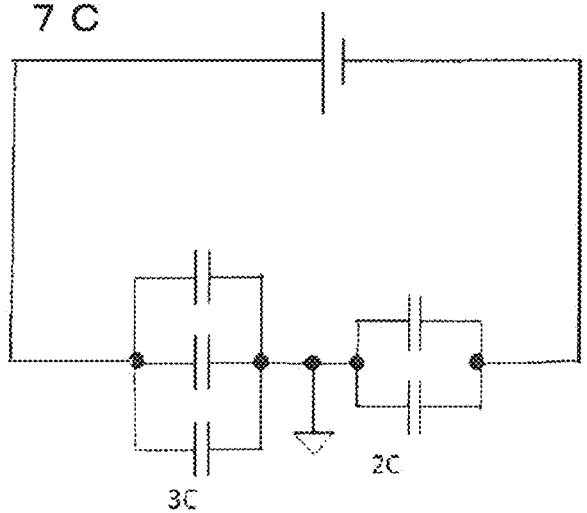

FIGS. 7A, 7B, and 7C are equivalent circuit diagrams of the solar battery module 13 and the solar battery string 10 for describing an operation principle of the failure diagnosis device 20 determining the position of the faulty solar battery module 13 according to the present embodiment. FIG. 7A is a diagram simplifying an equivalent circuit of the solar battery module 13. FIGS. 7B and 7C are equivalent circuit diagrams of the solar battery string 10 at the time of applying the positive DC voltage V0 from the negative electrode side to the positive electrode side of the solar battery string 10 when the bypass diode 13b-1 of the third solar battery module 13 from the negative electrode side of the solar battery string 10 in FIG. 1 is faulty.

As illustrated in FIG. 7A, in the equivalent circuit at the time of applying the AC voltage to the solar battery module 13, the solar battery cluster 13a-2 is made up of a parallel resistance component Rsh and capacitive component Cd and a series resistance component Rs of the solar battery cell 13a-1, and is further expressed by the bypass diode 13b-1 parallelly connected to the solar battery cluster 13a-2 and a capacitive component Ce between the solar battery module 13 and the frame 13c. FIG. 7A illustrates an equivalent circuit diagram of the solar battery module 13 in which the three solar battery clusters 13a-2 are connected in series.

When the positive DC voltage V0 is applied from the negative electrode side to the positive electrode side of the solar battery string 10, voltage is applied to the solar battery module 13 which does not include the faulty bypass diode 13b-1 in a forward direction of the bypass diode 13b-1, thus the bypass diode 13b-1 can be treated as an approximately short circuit. The capacitive component Cd parallelly connected to the bypass diode 13b-1 can be treated as open by reason that the DC voltage is applied. The parallel resistance component Rsh parallelly connected to the bypass diode 13b-1 can be considered approximately open by reason that it has a large resistance value with respect to the resistance component of the bypass diode 13b-1. That is to say, as illustrated in FIG. 7B, the solar battery module 13 which does not include the faulty bypass diode 13b-1 can be considered to be equivalent to a short-circuit wiring connected to the adjacent solar battery module 13 and the capacitive component C between the solar battery module 13 and the frame 13c.

In contrast, in the solar battery module 13 including the faulty bypass diode 13b-1, the current does not flow even when the forward voltage is applied to the bypass diode in which the open fault occurs. The parallel resistance component Rsh is dominant in the solar battery module 13 including the faulty bypass diode 13b-1. For simplification, when the capacitance between the solar battery module 13 including the faulty bypass diode 13b-1 and the frame 13c is approximately the same as the capacitance C between the solar battery module 13 which does not include the faulty bypass diode 13b-1 and the frame 13c, as illustrated in FIG. 7B, the solar battery module 13 including the faulty bypass diode 13b-1 can be considered to be equivalent to the parallel resistance component Rsh of the solar battery cluster 13a-2 and the capacitive component C between the solar battery module 13 and the frame 13c. That is to say, when the bypass diode 13b-1 of the third solar battery module 13 from the negative electrode side of the solar battery string 10 in FIG. 1 is faulty, an equivalent circuit of the solar battery string 10 in the case of applying the positive DC voltage V0 from the negative electrode side to the positive electrode side of the solar battery string 10 is an equivalent circuit illustrated in FIG. 7B.

Furthermore, the parallel resistance component Rsh of the equivalent circuit of the solar battery string 10 in FIG. 7B has a sufficient large resistance value, thus considered approximately open. Then, as illustrated in FIG. 7C, when the positive DC voltage V0 is applied from the negative electrode side to the positive electrode side of the solar battery string 10 in the case where the bypass diode 13b-1 of the third solar battery module 13 from the negative electrode side of the solar battery string 10 in FIG. 1 is faulty, a ground electrostatic capacitance on the positive electrode side of the solar battery string 10 is 2 C and a ground electrostatic capacitance on the negative electrode side of the solar battery string 10 is 3 C. The ground electrostatic capacitance of the solar battery string 10 is divided in series. That is to say, the ground electrostatic capacitance of the solar battery string 10 is divided in a different position in series by the position of the solar battery module 13 including the faulty bypass diode 13b-1.

As described above, in the case where the positive DC voltage V0 is applied from the negative electrode side to the positive electrode side of the solar battery string 10, the ground capacitive component Cp (2 C) on the positive electrode side of the solar battery string 10 and the ground electrostatic capacitance Cn (3 C) on the negative electrode side are located in series, thus when the electrostatic capacitive component Cn on the negative electrode side is charged with Q electric charge, an electrostatic amount with which the ground electrostatic capacitance Cp on the positive electrode side is charged is −Q. Thus, in accordance with a relationship of Q=CV, Cp×(−Vp-gnd)=Cn×Vn-gnd is established, thus −Vp-gnd:Vn-gnd=Cn:Cp is established. That is to say, the ground electrostatic capacitance is differently divided by the position of the solar battery cluster 13a-2 including the faulty bypass diode 13b-1. Thus, a ratio of the voltage Vp-gnd to the voltage Vn-gnd indicates different values in each position of the solar battery module 13 including the bypass diode 13b-1 in the solar battery string 10.

After the voltage Vp-gnd and the voltage Vn-gnd indicate the voltage value of the partial pressure ratio based on the position of the faulty solar battery module 13, the current by the DC voltage V0 flows in the resistance 23 and the resistance 24, thus the voltage Vp-gnd and the voltage Vn-gnd converge to the ratio of the resistance value of the resistance 23 and the resistance 24. In the present embodiment, the resistance 23 and the resistance 24 are equal to each other, thus converge to −Vp-gnd=Vn-gnd. Herein, a time constant to which the voltage Vp-gnd converges is determined by a product of the capacitance between the positive electrode side of the solar battery string 10 and the frame 13c and the resistance 24. A time constant to which the voltage Vn-gnd converges is determined by a product of the capacitance between the negative electrode side of the solar battery string 10 and the frame 13c and the resistance 23.

As described above, in the failure determination part 36 according to the present embodiment, −Vp-gnd/V0 indicating the different value in accordance with the position of the solar battery module 13 including the faulty bypass diode 13b-1 in the solar battery string 10 can be calculated based on the above operation principle, and the position of the solar battery module 13 including the faulty bypass diode 13b-1 in the solar battery string 10 can be specified based on −Vp-gnd/V0.

Herein, it is necessary that the positive electrode side and the negative electrode side of the solar battery string 10 are not charged with electric charge to accurately specify the position of the faulty solar battery module 13. When the positive electrode side or the negative electrode side of the solar battery string 10 are charged with the electric charge by some cause, the ground voltage on the positive electrode side or the negative electrode side of the solar battery string 10 indicates a different value compared with a case where those sides are not charged with the electric charge previously. Accordingly, there is a case where the ratio of the voltage −Vp-gnd to the voltage Vn-gnd indicates the different value and the accurate position of the solar battery module including the faulty solar battery string 10 cannot be specified. Thus, the electric charge of the positive electrode side and the negative electrode side of the solar battery string 10 is preferably a value close to zero before Step S12. That is to say, Step S11 is performed before Step 12, the electric charge charged to the positive electrode side and the negative electrode side of the solar battery string 10 can be removed to the ground, thus the position of the faulty solar battery module 13 can be accurately specified.

In the present embodiment, when the resistance value of the resistance 24 is R[Ω] and the ground electrostatic capacitance of the solar battery string 10 is Ce [F], the switches 21a, 21b, and 21c are preferably kept on for 5R×Ce [seconds] or more to sufficiently discharge the electric charge confined in the positive electrode side and the negative electrode side of the solar battery string 10. Herein, the electric charge discharge time in a case where the number of solar battery modules connected in series in the solar battery string 10 is n is nR×Ce [seconds] or more.

Herein, in the description of the present embodiment, the portion between the positive electrode side of the solar battery string 10 and the frame 13c and the portion between the negative electrode side of the solar battery string 10 and the frame 13c are electrically connected and grounded, however, it is also applicable that one of the portion between the positive electrode side of the solar battery string 10 and the frame 13c and the portion between the negative electrode side of the solar battery string 10 and the frame 13c is electrically connected and grounded.

Figure 8:
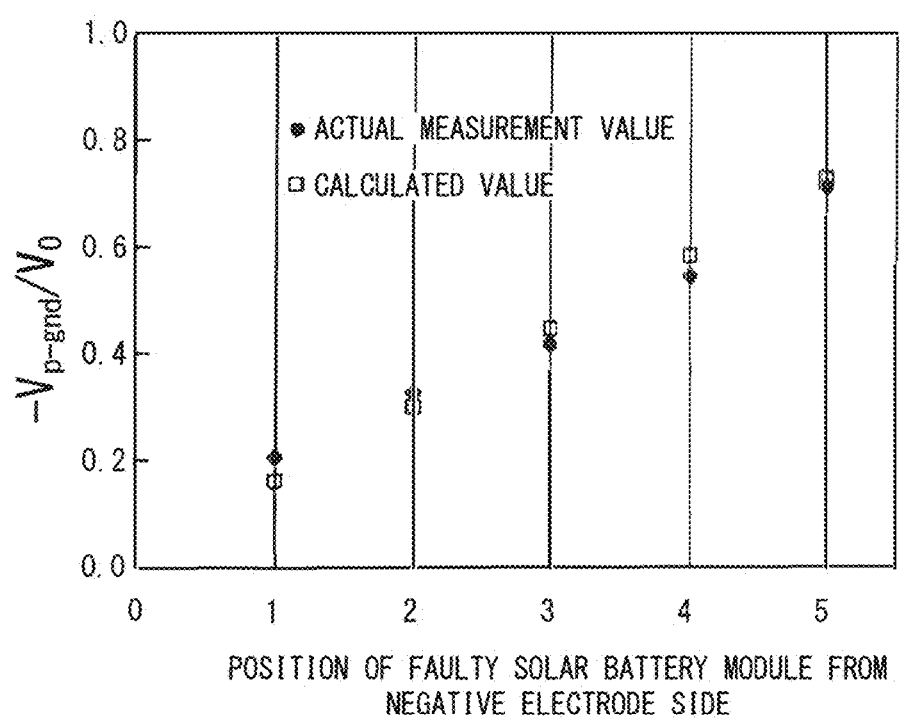
FIG. 8 A diagram illustrating a relationship between the position of the faulty solar battery module and a measured voltage value according to the embodiment 1.

FIG. 8 is a diagram illustrating a relationship between a position of the solar battery string 10 including the faulty solar battery module 13 numbered from the negative electrode side and a ratio of the measured voltage value −Vp-gnd to the DC voltage V0 according to the present embodiment. FIG. 8 illustrates a result (calculated value) calculated by an equivalent circuit based on the operation principle described above and a result (actual measurement value) measured by an actual experimental result.

As illustrated in FIG. 8, the calculated value and the actual measurement value substantially coincide with each other, and indicate a tendency of linearly increasing depending on the position of the faulty solar battery module 13. Accordingly, −Vp-gnd/V0 for each position of the solar battery module 13 in which the open fault occurs in the bypass diode 13b-1 is obtained previously by the value calculated from the circuit parameter obtained previously, and is stored in a storage medium such as a memory of the failure determination part 36, for example, thus the failure determination part 36 compares −Vp-gnd/V0 calculated from the voltage Vp-gnd measured in Step S13 and −Vp-gnd/V0 obtained by calculation, thereby being able to specify the position of the faulty solar battery module 13.

When the number of the solar battery modules 13 connected in series to constitute the solar battery string 10 is n, the position of the faulty solar battery module 13 numbered from the negative electrode side is expressed by n×Vn-gnd/(−Vp-gnd+Vn-gnd). That is to say, in the present embodiment, the solar battery string 10 includes five solar battery modules 13, thus the position of the faulty solar battery module 13 numbered from the negative electrode side is expressed by 5×Vn-gnd/(−Vp-gnd+Vn-gnd). Thus, it is also applicable to subtract the voltage value Vp-gnd from the DC voltage V0 based on the measured voltage value Vp-gnd to obtain the voltage Vn-gnd, and specify the position of the faulty solar battery module 13 numbered from the negative electrode side using the above expression.

However, there is a case where in an actual solar battery module, the bypass diode which is not faulty is not in an ideal short-circuit state but cannot pass electric charge sufficient for charging the ground electrostatic capacitive component of all the solar battery modules, so that the position of the faulty solar battery module 13 numbered from the negative electrode side cannot be specified by the above expression. Specifically, the capacitive component Cd of the solar battery cluster 13a-2 needs to be charged and positive voltage needs to be applied between an anode and a cathode of the bypass diode based on the cathode to turn on the bypass diode 13b-1 illustrated in FIG. 7A. In this voltage value, the DC voltage V0 is divided by all the bypass diodes which are connected in series and are not faulty, thus there is a case where the voltage applied in a forward direction decreases and current sufficient for charging the ground capacitive components of all the solar battery modules does not flow. In this case, an amount of charge to the ground electrostatic capacitive component of the solar battery module in a position far away from the positive electrode side or the negative electrode side decreases, thus a value expressed by n×Vn-gnd/(−Vp-gnd+Vn-gnd) may indicate a position closer to a center side of the solar battery string than an actual failure position. In such a case, the above expression needs to be corrected so that the value thereof coincides with the actual failure position. An error of the position of the faulty module occurring by a case where the bypass diode is in an ideal short-circuit state and a case where an actual bypass diode is used depends on a reverse saturation current value Is and an applied voltage V0 of the bypass diode, thus when these values are previously obtained and corrected by a circuit calculation, more accurate failure position can be determined.

As described above, the failure diagnosis device for the solar battery string, the solar power generation system provided with the same, and the failure diagnosis method for the solar battery string according to the present embodiment can accurately specify the position of the faulty solar battery module in the solar battery string, particularly the position of the solar battery module including the faulty bypass diode.

Conventionally, the failure diagnosis can be performed for only each solar battery string, and a large amount of time and labor is required for specifying the faulty solar battery module in the solar battery string, however, the failure diagnosis device for the solar battery string, the solar power generation system provided with the same, and the failure diagnosis method for the solar battery string according to the present embodiment can accurately specify the position of the faulty solar battery module in the solar battery string, thus the time and labor required for the failure diagnosis of the solar battery module in the solar battery string can be significantly reduced.

Embodiment 2

In the solar power generation system 100 and the failure diagnosis device 20 of the solar battery string 10 according to the present embodiment, differing from the embodiment 1, when the failure determination part 36 determines that there is a cable disconnection, the failure determination part 36 determines a position of an occurrence of the cable disconnection.

Specifically, the failure determination part 36 determines which position in the output cables 14-1 and 14-2 connecting the solar battery modules 13, the cable 12-1 connecting the solar battery module 13 and the power conditioner 30 of the solar power generation system 100, and the cable 12-2 connecting the solar battery module 13 and the backflow prevention diode 40 of the solar power generation system 100 includes the cable disconnection. The failure determination part 36 also determines the position of the solar battery modules 13 in which the output cables 14-1 and 14-2 are disconnected.

Schematic configurations of the solar power generation system 100 and the failure diagnosis device 20 of the solar battery string 10 according to the present embodiment are the same as those of FIG. 1 to FIG. 3 in the embodiment 1, and a description of a similar configuration other than characterizing portions of the failure diagnosis device 20 according to the present embodiment is omitted.

Figure 9:
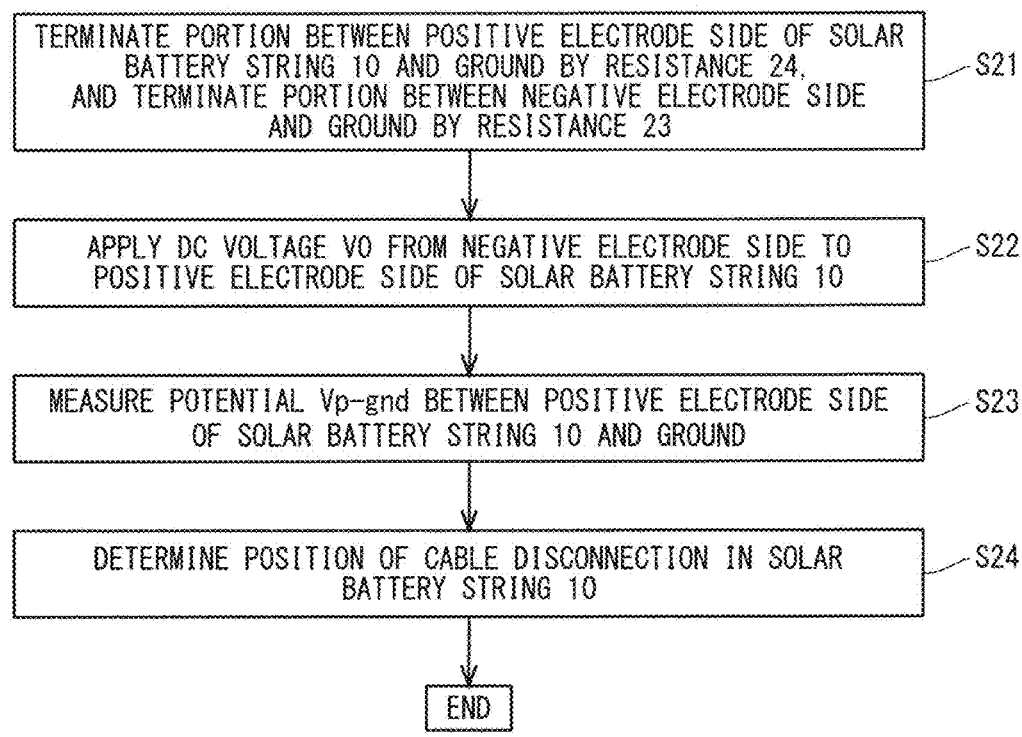
FIG. 9 A flow chart illustrating an operation of a failure diagnosis device determining a position of a cable disconnection according to an embodiment 2.

An operation of the solar power generation system 100 and the failure diagnosis device 20 of the solar battery string 10 according to the present embodiment is described next. FIG. 9 is a flow chart illustrating an operation of a failure diagnosis device determining a position of a cable disconnection according to the present embodiment. The process of determining the cable disconnection performed by the failure determination part 36 in FIG. 4 is similar to that in the embodiment 1, thus the detailed description is omitted, and only the point different from the embodiment 1 is described.

Firstly, as illustrated in FIG. 4, the failure diagnosis device 20 starts the diagnosis of the solar battery string 10 in the manner similar to the embodiment 1, and when the failure determination part 36 determines that the solar power generation system 100 includes a cable disconnection through the processes of Step S01 to Step S04, the process proceeds to a third failure determination process of specifying a position of the cable disconnection in FIG. 9.

Next, as illustrated in FIG. 9, the switch 21b is turned on, and the ground wiring 16 of the solar battery string 10 is electrically connected to the resistance 23 and the resistance 24. Accordingly, the positive electrode side of the solar battery string 10 is electrically connected to the ground wiring 16 via the resistance 24, and a portion between the positive electrode side of the solar battery string 10 and the ground is terminated by the resistance 24. The negative electrode side of the solar battery string 10 is electrically connected to the ground wiring 16 via the resistance 23, and a portion between the negative electrode side of the solar battery string 10 and the ground is terminated by the resistance 23 (S21). Accordingly, the positive electrode side of the solar battery string 10, the positive electrode side of the solar battery string 10, and the grounded frame have equivalent potential.

Next, the switch 25a is turned on again, and the positive DC voltage V0 is applied from the negative electrode side to the positive electrode side of the solar battery string 10 (S22). A rise time of the voltage at the time of applying the DC voltage is preferably as fast as possible, and for example, the DC voltage V0 is applied at a through rate of 10V/μs by a high-speed switching of a MOSFET. At this time, both the resistance 23 and the resistance 24 may be paralleled off from the contact point 26 immediately before the voltage is applied by a switch not shown in the drawings.

Next, the voltmeter 22a measures the value of the potential Vp-gnd between the positive electrode side of the solar battery string 10 and the ground at the time of applying the DC voltage V0 (S23). Although details are described hereinafter, at this time, the potential Vp-gnd between the positive electrode side of the solar battery string 10 and the ground indicates a voltage value depending on the position of the disconnected cable. The measured voltage value Vp-gnd is inputted to the measurement control part 34.

Next, the failure determination part 36 determines the position of the cable disconnection based on the voltage value Vp-gnd inputted to the measurement control part 34 (S24). Although details are described hereinafter, the position of the cable disconnection depends on −Vp-gnd/V0 immediately after the DC voltage V0 is applied. Thus, the failure determination part 36 calculates −Vp-gnd/V0 and specifies the position of the cable disconnection based on −Vp-gnd/V0.

Subsequently, the failure determination part 36 transmits a notification that the solar power generation system 100 includes the cable disconnection. The failure determination part 36 further transmits a notification of a position result of the cable disconnection determined in Step S24 to a user.

Finally, the switches 21a, 21b, 21c, and 25a are turned off, and the failure diagnosis device 20 is electrically separated from the solar battery string 10 to finish the third failure determination process of determining the position where the cable disconnection occurs.

Described next using FIGS. 7A, 7B, and 7C is a detailed operation principle of the solar power generation system 100 and the failure diagnosis device 20 of the solar battery string 10 according to the present embodiment.

FIG. 7B is an equivalent circuit diagram in a case where the bypass diode 13b-1 of the third solar battery module 13 from the negative electrode side of the solar battery string 10 in FIG. 1 in the embodiment 1 is faulty. When any of the output cables 14-1 and 14-2 of the third solar battery module 13 from the negative electrode side of the solar battery string 10 in FIG. 1 in the embodiment 2 is disconnected, the parallel resistance component Rsh in FIG. 7B can be considered open. Thus, in the embodiment 2, as illustrated in FIG. 7C, when the positive DC voltage V0 is applied from the negative electrode side to the positive electrode side of the solar battery string 10 in the case where any of the output cables 14-1 and 14-2 of the third solar battery module 13 from the negative electrode side of the solar battery string 10 in FIG. 1 is faulty, a ground electrostatic capacitance on the positive electrode side of the solar battery string 10 is 2 C and a ground electrostatic capacitance on the negative electrode side of the solar battery string 10 is 3 C. The ground electrostatic capacitance of the solar battery string 10 is divided in series. That is to say, the ground electrostatic capacitance of the solar battery string 10 is divided in series at a different position depending on the position of the cable disconnection of any of the output cables 12-1 and 12-2 and the output cables 14-1 and 14-2 of the solar battery module 13 in the solar battery string.

As described above, when the positive DC voltage V0 is applied from the negative electrode side to the positive electrode side of the solar battery string 10, the ground electrostatic capacitance is differently divided by the position of the cable disconnection of any of the output cables 12-1 and 12-2 and the output cables 14-1 and 14-2 of the solar battery module 13 in the solar battery string. Thus, a ratio of the voltage Vp-gnd to the voltage Vn-gnd indicates a different value for each position of the cable disconnection of the output cables 12-1 and 12-2 and the output cables 14-1 and 14-2 of the solar battery modules 13 in the solar battery string.

As described above, the equivalent circuit diagram according to the embodiment 1 is the same as that according to the embodiment 2, thus the diagram indicating the relationship between the position of the faulty solar battery module 13 numbered from the negative electrode side of the solar battery string 10 and the ratio of the measured voltage value −Vp-gnd to the DC voltage V0 in FIG. 8 also has a similar tendency.

The failure determination part 36 according to the present embodiment can calculate −Vp-gnd/V0 indicating the different value depending on the position of the cable disconnection of the output cables 12-1 and 12-2 and the output cables 14-1 and 14-2 of the solar battery module 13 in the solar battery string based on the above operation principle, and specify the position of the cable disconnection of the output cables 12-1 and 12-2 and the output cables 14-1 and 14-2 of the solar battery module 13 in the solar battery string 10 based on −Vp-gnd/V0.

As described above, the failure diagnosis device for the solar battery string, the solar power generation system provided with the same, and the failure diagnosis method for the solar battery string according to the present embodiment can accurately specify the position of the faulty solar battery module in the solar battery string, particularly the position of the cable disconnection of the solar battery module in the solar battery string and the position of the disconnection of the output cable of the solar battery string.

Conventionally, the failure diagnosis can be performed for only each solar battery string, and a large amount of time and labor is required for specifying the faulty solar battery module in the solar battery string, however, the failure diagnosis device for the solar battery string, the solar power generation system provided with the same, and the failure diagnosis method for the solar battery string according to the present embodiment can accurately specify the position of the faulty solar battery module in the solar battery string, thus the time and labor required for the failure diagnosis of the solar battery module in the solar battery string can be significantly reduced.

Embodiment 3

In the solar power generation system 100 and the failure diagnosis device 20 of the solar battery string 10 according to the present embodiment, differing from the embodiment 1 or the embodiment 2, when the failure determination part 36 determines that there is a faulty solar battery cluster 13a-2 in the solar battery module 13, the failure determination part 36 determines a position of the solar battery module 13 including the faulty solar battery cluster 13a-2 in the solar battery string 10.

Schematic configurations of the solar power generation system 100 and the failure diagnosis device 20 of the solar battery string 10 according to the present embodiment are the same as those of FIG. 1 to FIG. 3 in the embodiment 1, and a description of a similar configuration other than characterizing portions of the failure diagnosis device 20 according to the present embodiment is omitted.

Figure 10:
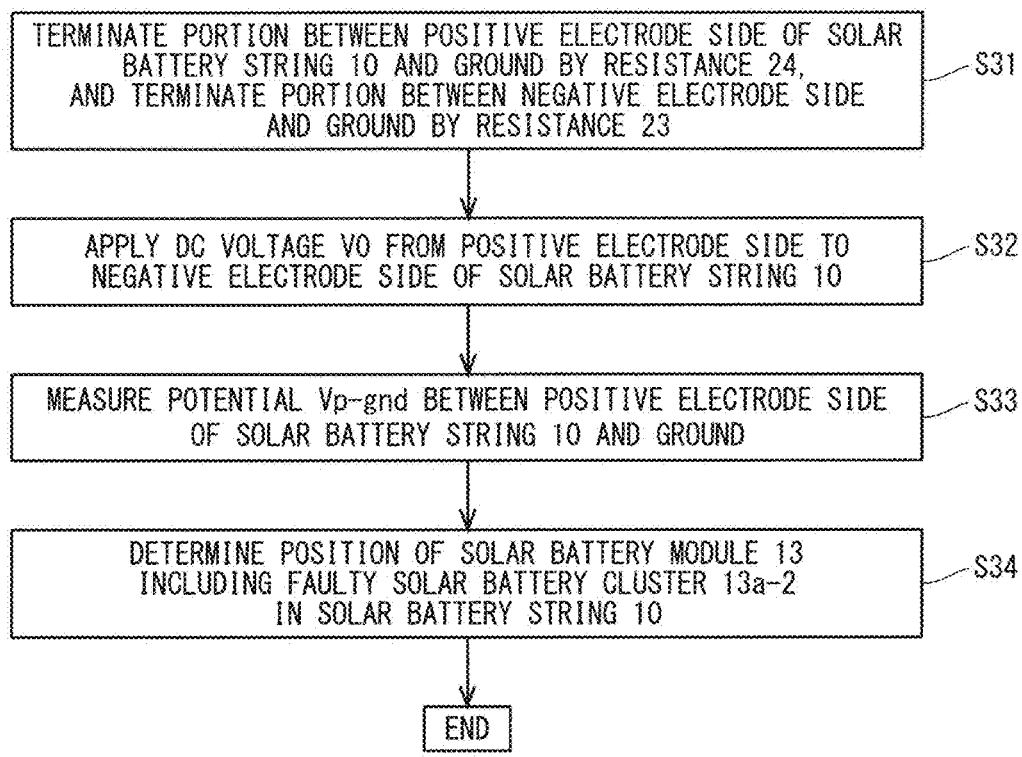
FIG. 10 A flow chart illustrating an operation of a failure diagnosis device determining a position of a solar battery module where a failure in a solar battery cluster occurs according to an embodiment 3.

An operation of the solar power generation system 100 and the failure diagnosis device 20 of the solar battery string 10 according to the present embodiment is described next. FIG. 10 is a flow chart illustrating an operation of the failure diagnosis device 20 determining the position of the solar battery module 13 where the failure in the solar battery cluster occurs according to the present embodiment. The process of determining the failure in the solar battery cluster performed by the failure determination part 36 in FIG. 4 is similar to that in the embodiment 1, thus the detailed description is omitted, and only the point different from the embodiment 1 is described.

Firstly, as illustrated in FIG. 4, the failure diagnosis device 20 starts the diagnosis of the solar battery string 10 in the manner similar to the embodiment 1, and when the failure determination part 36 determines that the solar battery string 10 includes the failure in the solar battery cluster through the processes of Step S01 to Step S04, the process proceeds to a fourth failure determination process of determining the position of the solar battery module 13 in which the failure in the solar battery cluster in FIG. 10 occurs.

Next, as illustrated in FIG. 10, the switch 21b is turned on, and the ground wiring 16 of the solar battery string 10 is electrically connected to the resistance 23 and the resistance 24. Accordingly, the positive electrode side of the solar battery string 10 is electrically connected to the ground wiring 16 via the resistance 24, and a portion between the positive electrode side of the solar battery string 10 and the ground is terminated by the resistance 24. The negative electrode side of the solar battery string 10 is electrically connected to the ground wiring 16 via the resistance 23, and a portion between the negative electrode side of the solar battery string 10 and the ground is terminated by the resistance 23 (S31). Accordingly, the positive electrode side of the solar battery string 10, the positive electrode side of the solar battery string 10, and the grounded frame have equivalent potential.

Next, the switch 25a is turned on again, and the positive DC voltage V0 is applied from the positive electrode side to the negative electrode side of the solar battery string 10 (S32). A rise time of the voltage at the time of applying the DC voltage is preferably as fast as possible, and for example, the DC voltage V0 is applied at a through rate of 10V/μs by a high-speed switching of a MOSFET. At this time, both the resistance 23 and the resistance 24 may be paralleled off from the contact point 26 immediately before the voltage is applied by a switch not shown in the drawings.

Next, the voltmeter 22a measures the value of the potential Vp-gnd between the positive electrode side of the solar battery string 10 and the ground at the time of applying the DC voltage V0 (S33). Although details are described hereinafter, the potential Vp-gnd between the positive electrode side of the solar battery string 10 and the ground indicates a voltage value depending on the position of the solar battery module 13 in which the failure in the solar battery cluster occurs. The measured voltage value Vp-gnd is inputted to the measurement control part 34.

Next, the failure determination part 36 determines the position of the solar battery modules 13 in which the failure in the solar battery cluster occurs based on the voltage value Vp-gnd inputted to the measurement control part 34 (S34). Although details are described hereinafter, the position of the solar battery module 13 in which the failure in the solar battery cluster occurs depends on Vp-gnd/V0 immediately after the DC voltage V0 is applied. Thus, the failure determination part 36 calculates Vp-gnd/V0, and determines the position of the solar battery modules 13 in which the failure in the solar battery cluster occurs based on Vp-gnd/V0.

Subsequently, the failure determination part 36 transmits a notification that the solar battery string 10 includes the failure in the solar battery cluster. The failure determination part 36 further transmits a notification of a position result of the solar battery modules 13 in which the failure in the solar battery cluster occurs determined in Step S34 to a user.

Finally, the switches 21a, 21b, 21c, and 25a are turned off, and the failure diagnosis device 20 is electrically separated from the solar battery string 10 to finish the fourth failure determination process of determining the position of the solar battery modules 13 in which the failure in the solar battery cluster occurs.

Described next using FIGS. 7A, 7B, and 7C is a detailed operation principle of the solar power generation system 100 and the failure diagnosis device 20 of the solar battery string 10 according to the present embodiment.

When the positive DC voltage V0 is applied from the positive electrode side to the negative electrode side of the solar battery string 10 in the case where the solar battery cluster 13a-2 of the third solar battery module 13 from the negative electrode side of the solar battery string 10 in FIG. 1 in the embodiment 1 is faulty, the bypass diode 13b-1 of the solar battery modules 13 is a reverse bias, thus current does not flow, and the current flows in the solar battery cluster 13a-2 of the solar battery module 13 which is not faulty, and does not flow in the solar battery cluster 13a-2 of the faulty solar battery module 13.

FIG. 7B is an equivalent circuit diagram in a case where the bypass diode 13b-1 of the third solar battery module 13 from the negative electrode side of the solar battery string 10 in FIG. 1 in the embodiment 1 is faulty. When the solar battery cluster 13a-2 of the third solar battery module 13 from the negative electrode side of the solar battery string 10 in FIG. 1 in the embodiment 3 is faulty, the parallel resistance component Rsh in FIG. 7B can be considered open. When resistance of the solar battery cluster 13a-2 of the solar battery module 13 which is not faulty is considered to be significantly small, as illustrated in FIG. 7B, the solar battery cluster 13a-2 of the solar battery module 13 which is not faulty can be considered short circuit.

That is to say, in the embodiment 3, as illustrated in FIG. 7C, when the positive DC voltage V0 is applied from the positive electrode side to the negative electrode side of the solar battery string 10 in the case where the solar battery cluster 13a-2 of the third solar battery module 13 from the negative electrode side of the solar battery string 10 in FIG. 1 is faulty, a ground electrostatic capacitance on the positive electrode side of the solar battery string 10 is 2 C and a ground electrostatic capacitance on the negative electrode side of the solar battery string 10 is 3 C. The ground electrostatic capacitance of the solar battery string 10 is divided in series. That is to say, the ground electrostatic capacitance of the solar battery string 10 is divided in a different position in series by the position of the solar battery module 13 in which the failure in the solar battery cluster occurs.

As described above, when the positive DC voltage V0 is applied from the positive electrode side to the negative electrode side of the solar battery string 10, the ground electrostatic capacitance is differently divided by the position of the solar battery module 13 in which the failure in the solar battery cluster occurs. Thus, a ratio of the voltage Vp-gnd to the voltage Vn-gnd indicates a different value for each position of the solar battery module 13 in which the failure in the solar battery cluster occurs.

As described above, the equivalent circuit diagram according to the embodiment 1 is the same as that according to the embodiment 3, however, the way of applying the DC voltage V0 is reverse, thus in the diagram indicating the relationship between the position of the faulty solar battery module 13 numbered from the negative electrode side of the solar battery string 10 and the ratio of the measured voltage value Vp-gnd to the DC voltage V0 in FIG. 8, a vertical axis indicates Vp-gnd/V0 in place of −Vp-gnd/V0, but has a tendency similar to the embodiment 1.

The failure determination part 36 according to the present embodiment can calculate Vp-gnd/V0 indicating a different value in accordance with the position of the solar battery modules 13 in which the failure in the solar battery cluster occurs based on the above operation principle, and specify the position of the solar battery modules 13 in which the failure in the solar battery cluster occurs based on Vp-gnd/V0.

As described above, the failure diagnosis device for the solar battery string, the solar power generation system provided with the same, and the failure diagnosis method for the solar battery string according to the present embodiment can accurately specify the position of the faulty solar battery module in the solar battery string, particularly the position of the solar battery module 13 in which the failure in the solar battery cluster occurs.

Conventionally, the failure diagnosis can be performed for only each solar battery string, and a large amount of time and labor is required for specifying the faulty solar battery module in the solar battery string, however, the failure diagnosis device for the solar battery string, the solar power generation system provided with the same, and the failure diagnosis method for the solar battery string according to the present embodiment can accurately specify the position of the faulty solar battery module in the solar battery string, thus the time and labor required for the failure diagnosis of the solar battery module in the solar battery string can be significantly reduced.

Embodiment 4

A solar power generation system 200 according to the present embodiment is different from those according to the embodiment 1 to the embodiment 3, but can specify the position of failure in the bypass diode or the position of the cable disconnection without separating the power conditioner from the solar battery string.

Figure 11:
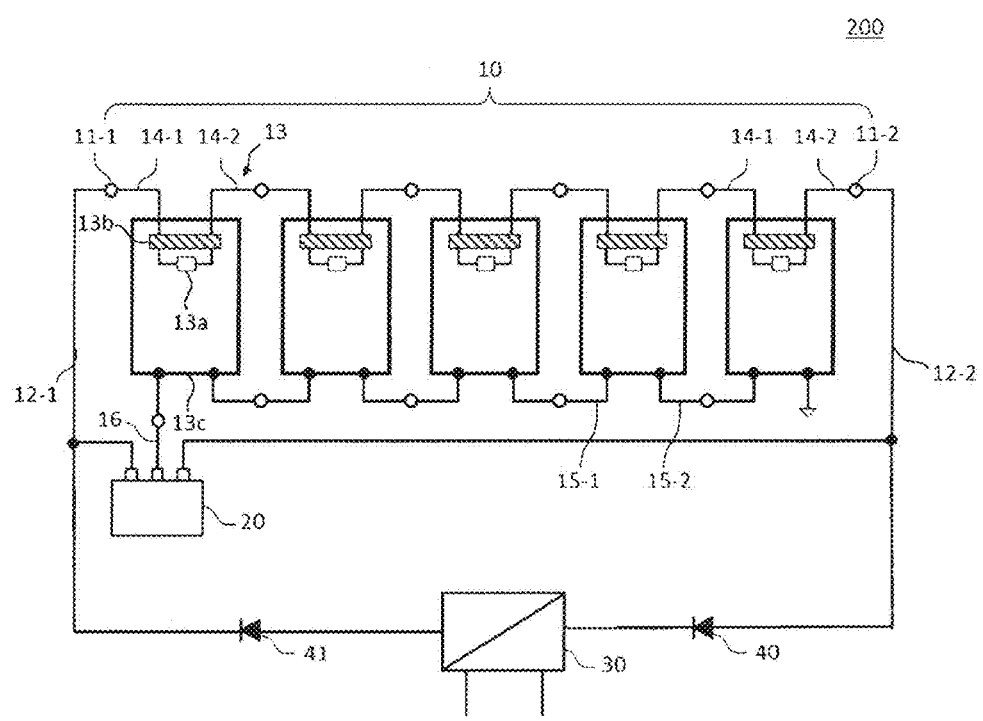
FIG. 11 A diagram schematically illustrating a configuration of a solar power generation system according to an embodiment 4.

FIG. 11 is a diagram schematically illustrating a configuration of a solar power generation system according the present embodiment.

As illustrated in FIG. 11, a backflow prevention diode 41 is connected between the output terminal 11-1 on the negative electrode side of the solar battery string 10 and the power conditioner 30, an anode of the backflow prevention diode 41 is connected to the power conditioner 30, and a cathode of the backflow prevention diode 41 is connected to the output terminal 11-1 on the negative electrode side and the switch 21a of the failure diagnosis device 20. The other configuration assigned with the same reference sign is the same as that in FIG. 1 to FIG. 3 in the embodiment 1, thus the description thereof is omitted.

An operation of the solar power generation system 100 and the failure diagnosis device 20 of the solar battery string 10 according to the present embodiment is described next.

The embodiment 1 to the embodiment 3 include the process of separating the solar battery string 10 and the power conditioner 30 before the first failure diagnosis process, however, in the present embodiment, the solar battery string 10 and the power conditioner 30 are not separated from each other, but the first failure determination process in the embodiment 1 and the second failure determination process in the embodiment 1 or the third failure determination process in the embodiment 2 are performed. The first failure determination process to the third failure determination process in the present embodiment are similar to those in the embodiment 1 or embodiment 2, thus the description thereof is omitted.

According to this configuration, when the switch 25a is turned on and the DC voltage V0 is applied between the output terminal 11-2 on the positive electrode side and the output terminal 11-1 on the negative electrode side of the solar battery string 10 in a direction opposite to electro motive force, the backflow prevention diode 40 and the backflow prevention diode 41 can prevent the current from flowing in a ground capacitive component not shown in the drawings included in the power conditioner 30. Normally, there is a case where the ground electrostatic capacitive component included in the power conditioner 30 is combined with the ground electrostatic capacitive component of the solar battery string 10, thus the position of the solar battery modules 13 including the faulty bypass diode 13b-1 in the solar battery string 10 and the position of the cable disconnection cannot be obtained accurately by measuring the ground electrostatic capacitive component. However, in the solar power generation system 200 according to the present embodiment, the ground electrostatic capacitive component included in the power conditioner 30 needs not be concerned in accordance with the backflow prevention diode 41, thus the position of the faulty solar battery module 13, particularly the position of the solar battery module 13 including the faulty bypass diode 13b-1 in the solar battery string 10 and the position of the cable disconnection can be accurately obtained without separating the solar battery string 10 and the power conditioner 30 from each other.

As described above, the solar power generation system according to the present embodiment can accurate obtain the position of the faulty solar battery module, particularly the position of the solar battery module including the faulty bypass diode in the solar battery string and the position of the cable disconnection without separating the solar battery string and the power conditioner from each other, thus the time and labor required for the failure diagnosis of the solar battery module in the solar battery string can be significantly reduced.

Embodiment 5

A solar power generation system 100 according to the present embodiment is different from those according to the embodiment 1 to the embodiment 4, but starts diagnosis when the solar battery module 13 generates electro motive force by irradiation with light such as a case where the solar power generation part 13a of the solar battery modules 13 starts power generation to be able to specify the position of failure in the bypass diode.

Schematic configurations of the solar power generation system 100 and the failure diagnosis device 20 of the solar battery string 10 according to the present embodiment are the same as those of FIG. 1 to FIG. 3 in the embodiment 1, and a description of a similar configuration other than characterizing portions of the failure diagnosis device 20 according to the present embodiment is omitted.

An operation of the solar power generation system 100 and the failure diagnosis device 20 of the solar battery string 10 according to the present embodiment is described next. A diagnosis process in FIG. 4 and FIG. 5 performed by the failure determination part 36 is similar to that in the embodiment 1, thus the detailed description is omitted.

In the solar power generation system 100 and the failure diagnosis device 20 of the solar battery string 10 according to the present embodiment, a diagnosis process in FIG. 5 of specifying the position of failure in the bypass diode 13b-1 is performed when the solar battery module 13 generates the electro motive force by irradiation with light. Specifically, for example, the diagnosis is performed during a period of time when the electro motive force by irradiation with light is small such as the morning when the solar power generation part 13a of the solar battery modules 13 starts power generation or the evening when the electro motive force decreases. Herein, the diagnosis is performed during a period of time when the electro motive force by irradiation with light is small by reason that when the electro motive force is large, the voltage applied at the time of diagnosis is offset and the diagnosis cannot be performed. Thus, the electro motive force by irradiation with light from the solar battery modules 13 needs to be sufficiently small electro motive force to be able to perform the diagnosis process in FIG. 5. Specifically, the electro motive force of the solar battery string by irradiation with light from the solar battery modules 13 is preferably equal to or smaller than electro motive force of the DC voltage apply part 25 so as to be able to be canceled out by the electro motive force of the DC voltage apply part 25.

Thus, for example, during the period of time in the morning, the voltage between the cables 12-1 and 12-2 of the solar battery string 10 is measured, and when the voltage on the positive electrode of the solar battery string 10 with respect to the negative electrode is larger than 0V, the diagnosis process in FIG. 5 is started. For example, during the period of time in the evening, the voltage between the cables 12-1 and 12-2 of the solar battery string 10 is measured, and when the voltage on the positive electrode of the solar battery string 10 with respect to the negative electrode is sufficiently smaller such as $\frac{1}{100}$V or less of rated open voltage of the solar battery string, the diagnosis process in FIG. 5 is started.

Described in detail next is a reason why the process of performing the diagnosis of the position of failure in the bypass diode 13b-1 and specifying the position of failure are performed during the period of time when the electro motive force by irradiation with light is small.

Figure 12:
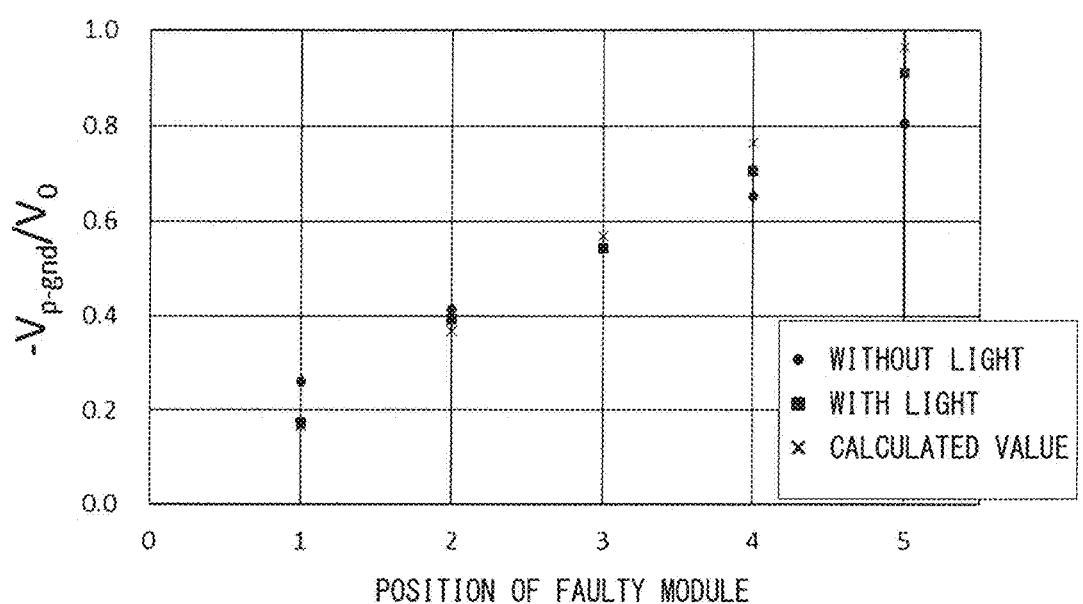
FIG. 12 A diagram illustrating a relationship between a position of a faulty solar battery module and a measured voltage value according to an embodiment 5.

FIG. 12 is a diagram illustrating a relationship between a position of the faulty solar battery module 13 numbered from the negative electrode side of the solar battery string 10 and a ratio of the measured voltage value −Vp-gnd to the DC voltage V0 according to the present embodiment. FIG. 12 illustrates a result (calculated value) calculated by an equivalent circuit based on the operation principle described in the embodiment 1 and a result measured by an experimental result in presence or absence of irradiation with light.

For example, an open voltage value of a solar battery panel as the solar power generation part 13a is approximately 0.3V for one panel, and is a value approximately $\frac{1}{100}$ of rated open voltage 30V of the solar battery module 13. When the diagnosis of the position of failure in the bypass diode 13b-1 in FIG. 5 is performed in a case where the solar battery panel is irradiated with light and the open voltage of the solar battery panel becomes 0.3V, a result close to the calculated value is obtained as illustrated in FIG. 12. In contrast, when the diagnosis of the position of failure in the bypass diode 13b-1 in FIG. 5 is performed in a case where the solar battery panel is not irradiated with light, a result deviating from the calculated value is obtained compared with the case where the solar battery panel is irradiated with light as illustrated in FIG. 12. That is to say, the position of failure in the bypass diode 13b-1 in FIG. 5 is specified when the solar battery modules 13 generates the electro motive force by irradiation with light as described above, thus the position of the solar battery modules 13 including the faulty bypass diode 13b-1 can be specified more accurately.

The reason thereof is described in more detail hereinafter. When the solar battery panel is not irradiated with light, the reverse saturation current value Is of the bypass diode 13b-1 is low with respect to the apply voltage V0, and the current does not sufficiently flow in the bypass diode 13b-1, thus an ideal short circuit cannot be considered to be achieved. In contrast, when the solar battery panel is irradiated with light, conductance of the solar battery cluster 13a-2 increases by irradiation with light, and a current component short-circuiting the solar battery cluster 13a-2 and flowing in the bypass diode 13b-1 increases, thus the solar battery cluster 13a-2 can be considered to be short-circuited compared with a case where the solar battery panel is not irradiated with light. Thus, when the solar battery panel is irradiated with light, a result close to a calculated expression can be obtained compared with the case where the solar battery panel is not irradiated with light. Accordingly, the position of failure in the bypass diode 13b-1 in FIG. 5 is specified during the period of time when the electro motive force by irradiation with light is small, thus the position of the solar battery modules 13 including the faulty bypass diode 13b-1 can be specified more accurately without correction by a circuit calculation.

As described above, the failure diagnosis device for the solar battery string, the solar power generation system provided with the same, and the failure diagnosis method for the solar battery string according to the present embodiment can more accurately specify the position of the faulty solar battery module in the solar battery string, particularly the position of the solar battery module including the faulty bypass diode compared with the embodiment 1.

In the description of the present embodiment herein, the diagnosis process in FIG. 5 of specifying the position of failure in the bypass diode is performed when the solar battery modules 13 generates the electro motive force by irradiation with light, however, the process of determining the failure cause of the solar battery string in FIG. 4 may also be performed during the same period of time. The present embodiment can also be adopted to the embodiment 2 to the embodiment 4, and the diagnosis may also be performed during a period of time when the electro motive force by irradiation with light from the solar power generation part 13a of the solar battery module 13 is small.

Herein, described in the above embodiment 1 to embodiment 5 is the example of measuring the value of the potential Vp-gnd between the positive electrode side as one end of the solar battery string 10 and the ground and determining the position of the faulty solar battery module 13, however, it is also applicable to measure the value of the potential Vn-gnd between the negative electrode side as the other end of the solar battery string 10 and the ground and determine the position of the faulty solar battery module 13 based on the value of the voltage value Vn-gnd. In such a case, it is sufficient that a voltmeter parallelly connected to the resistance 23 is provided to measure the voltage of the resistance 23. In such a case, the relationship between the position of the solar battery modules 13 in FIG. 8 and the measured voltage value Vn-gnd is different from the voltage Vp-gnd. The relationship between the position of the solar battery modules 13 and the measured voltage value Vn-gnd is reverse, that is to say, has a negative inclination.

Herein, described in the above embodiment 1 to embodiment 5 is the example of connecting the voltmeter 22a in parallel with the resistance 24 as illustrated in FIG. 3 and measuring the voltage at both ends of the resistance 24, however, it is also applicable to separately provide a voltmeter parallelly connected to the resistance 23 and measure the voltage of both the resistance 23 and the resistance 24. That is to say, it is also applicable to measure, with respect to a contact 26, both the value of the potential Vp-gnd between the positive electrode side as one end of the solar battery string 10 and the ground and the value of the potential Vn-gnd between the negative electrode side as the other end of the solar battery string 10 and the ground. In such a case, the position of the faulty solar battery module 13 is determined based on the values of both the voltage value Vp-gnd and the voltage value Vn-gnd, thus the position of the faulty solar battery module 13 in the solar battery string 10 can be specified more accurately compared with the embodiment 1 to the embodiment 4 described above.

Herein, the embodiment 1 to the embodiment 3 and the embodiment 5 may be individually used, at least two embodiments of the embodiment 1 to the embodiment 3 and the embodiment 5 may be collectively used, or all of the embodiment 1 to the embodiment 3 and the embodiment 5 may also be used.

Described in the embodiment 4 is the case of specifying the position of the solar battery module 13 including the faulty bypass diode as the embodiment 1, however, the embodiment 4 can be adopted to the embodiment 2. The embodiment 4 and the embodiment 4 to which the embodiment 2 is adopted may be individually used, or two embodiments may also be collectively used.

The embodiment 3 may be adopted to the embodiment 4. In such as case, the embodiment 3 is performed after the power conditioner 30 is separated from the solar battery string 10, thus the position of the solar battery module 13 including the faulty solar battery cluster 13a-2 in the solar battery string 10 can be specified.

According to the present disclosure, each embodiment can be arbitrarily combined, or each embodiment can be appropriately varied or omitted within the scope of the invention. Furthermore, the present disclosure is not limited to the above embodiments, but can be variously modified without departing from the scope of the disclosure in a practical phase. The above embodiments include the invention in various stages, thus the various inventions may be extracted by appropriate combinations in a plurality of constituent elements to be disclosed.

EXPLANATION OF REFERENCE SIGNS 100, 200 solar power generation system, 10 solar battery string, 12-1, 12-2, 14-1, 14-2, output cable, 13 solar battery module, 13a solar power generation part, 13a-2 solar battery cluster, 13b-1 bypass diode, 13c frame, 20 failure diagnosis device, 21a, 21b, 21c, 25a switch, 22a voltmeter, 22b ammeter, 25 DC voltage apply part, 25b DC power source, 30 power conditioner, 34 a measurement control part, 36 failure determination part, 40, 41 backflow prevention diode

The invention claimed is:
1. A solar power generation system, comprising:
a solar battery string; and
a failure diagnosis device connected to the solar battery string;
a power conditioner;
a first backflow prevention diode; and
a second backflow prevention diode, wherein the failure diagnosis device includes a plurality of solar battery modules having solar power generators and conductive frames, wherein the solar power generators of the plurality of solar battery modules are electrically connected in series, and the conductive frames of the plurality of solar battery modules electrically have common connection and are grounded, wherein the failure diagnosis device includes:
- a voltage supply to apply DC voltage between a positive electrode and a negative electrode of the plurality of solar battery modules connected in series in the solar battery string;
- measurement circuitry to measure potential, generated by applying the DC voltage, between (i) the positive electrode or the negative electrode of the plurality of solar battery modules connected in series in the solar battery string and (ii) ground of each of the conductive frames that are grounded; and
- failure determination circuitry to determine a position of a faulty solar battery module of the plurality of solar battery modules in the solar battery string based on the potential measured by the measurement circuitry, wherein the first backflow prevention diode has an anode connected to an output terminal on a positive electrode side of the solar battery string and a cathode connected to a positive electrode side of the power conditioner without passing through an output terminal on a negative electrode side of the solar battery string, and the second backflow prevention diode has an anode connected to a negative electrode side of the power conditioner without passing through an output terminal on the positive electrode side of the solar battery string and a cathode connected to an output terminal on the negative electrode side of the solar battery string.

2. The solar power generation system according to claim 1, wherein
each of the solar battery modules includes a bypass diode having an anode connected to a negative electrode side of the solar power generators and a cathode connected to a positive electrode side of the solar power generators, thereby being parallelly connected to any one of the solar power generators, and
the failure determination circuitry determines the position of the faulty solar battery module including the bypass diode which is faulty in the solar battery string.

3. The solar power generation system according to claim 1, wherein
the solar battery string includes a plurality of cables connecting the solar battery modules, the solar battery string, and a backflow prevention diode of a solar power generation system, and the solar battery string and a power conditioner of the solar power generation system, and
the failure determination circuitry determines a position of a disconnected cable in the plurality of cables.

4. The solar power generation system according to claim 1, wherein
each of the solar power generators includes a solar battery cluster in which a plurality of solar battery cells are connected in series, and
the failure determination circuitry determines the position of the faulty solar battery module including the solar battery cluster which is faulty in the solar battery string.

5. The solar power generation system according to claim 1, further comprising measurement control circuitry to perform control, before the DC voltage is applied, to electrically connect at least one of a portion between a positive electrode of the plurality of solar battery modules connected in series in the solar battery string and each of the conductive frames and a portion between a negative electrode of the plurality of solar battery modules connected in series in the solar battery string and each of the conductive frames.

6. The solar power generation system according to claim 1, wherein
the failure determination circuitry determines the position of the faulty solar battery module which is faulty in the solar battery string based on a result previously calculated by an equivalent circuit.

7. The solar power generation system according to claim 1, wherein
the voltage supply applies first positive DC voltage to a negative electrode side based on a positive electrode side of the plurality of solar battery modules connected in series in the solar battery string and applies second positive DC voltage to a positive electrode side based on a negative electrode side of the plurality of solar battery modules connected in series in the solar battery string,
the measurement circuitry measures each current value generated by applying the first positive DC voltage and the second positive DC voltage, and
the failure determination circuitry determines whether a failure cause of the solar battery string is any of a bypass diode failure, a cable disconnection, and a solar battery cluster failure, or there is no failure based on the current value.

8. The solar power generation system according to claim 2, wherein
the failure determination circuitry determines the position of the solar battery module including the bypass diode which is faulty in the solar battery string under a condition where at least one of the solar battery modules generates electro motive force by irradiation with light.

9. A failure diagnosis method for a solar battery string including a plurality of solar battery modules having solar power generators and conductive frames, wherein the plurality of solar battery modules are electrically connected in series, and the conductive frames of the plurality of solar battery modules electrically have common connection and are grounded, the failure diagnosis method comprising:
applying DC voltage between a positive electrode and a negative electrode of the plurality of solar battery modules connected in series in the solar battery string from a voltage supply;
measuring potential, generated by applying the DC voltage, between (i) the positive electrode or the negative electrode of the plurality of solar battery modules connected in series in the solar battery string and (ii) ground of each of the conductive frames that are grounded, by measurement circuitry; and
a failure determination process of determining, by a failure determination circuitry part, a position of a faulty solar battery module of the plurality of solar battery modules in the solar battery string based on the potential measured by the measurement circuitry,
wherein the potential measured for said measuring potential is generated based on application of only the DC voltage.

10. The failure diagnosis method for the solar battery string according to claim 9, wherein each of the solar battery modules includes a bypass diode having an anode connected to a negative electrode of the solar power generators and a cathode connected to a positive electrode of the solar power generators, thereby being parallelly connected to any one of the solar power generators, and the failure determination processes determines the position of the faulty solar battery module including the bypass diode which is faulty in the solar battery string.

11. The failure diagnosis method for the solar battery string according to claim 9, wherein the solar battery string includes a plurality of cables connecting the solar battery modules, the solar battery string and a backflow prevention diode of a solar power generation system, and the solar battery string and a power conditioner of the solar power generation system, and the failure determination process determines a position of a disconnected cable in the plurality of cables.

12. The failure diagnosis method for the solar battery string according to claim 9, wherein each of the solar power generators includes a solar battery cluster in which a plurality of solar battery cells are connected in series, and the failure determination process determines the position of the faulty solar battery module including the solar battery cluster which is faulty in the solar battery string.

13. The failure diagnosis method for the solar battery string according to claim 9, comprising:

applying first positive DC voltage to a negative electrode side from the voltage supply part based on a positive electrode side of the plurality of solar battery modules connected in series in the solar battery string;

applying second positive DC voltage to the positive electrode side from the voltage supply part based on a negative electrode side of the plurality of solar battery modules connected in series in the solar battery string; and measuring, by the measurement circuitry, each current value generated by applying the first positive DC voltage and the second positive DC voltage, wherein the failure determination process determines whether a failure cause of the solar battery string is any of a bypass diode failure, a cable disconnection, and a solar battery cluster failure, or there is no failure based on the current value.

14. The failure diagnosis method for the solar battery string according to claim 10, wherein the failure determination process determines the position of the solar battery module including the bypass diode which is faulty in the solar battery string under a condition where at least one of the solar battery modules generates electro motive force by irradiation with light.

15. A failure diagnosis device for a solar battery string including a plurality of solar battery modules having solar power generators and conductive frames, wherein the solar power generators of the plurality of solar battery modules are electrically connected in series, and the frames of the plurality of solar battery modules electrically have common connection and are grounded, the failure diagnosis device comprising:

a voltage supply applying DC voltage between a positive electrode and a negative electrode of the plurality of solar battery modules connected in series in the solar battery string;

measurement circuitry measuring potential, generated by applying the DC voltage, between the positive electrode or the negative electrode of the plurality of solar battery modules connected in series in the solar battery string and each of the frames; and failure determination circuitry determining a position of a faulty solar battery module in the solar battery string based on the potential measured by the measurement circuitry, wherein the potential measured by the measurement circuitry is generated based on application of only the DC voltage.

* * * * *